(12) United States Patent
Narita

(10) Patent No.: US 8,513,060 B2
(45) Date of Patent: Aug. 20, 2013

(54) MANUFACTURING METHOD USING MULTI-STEP ADHESIVE CURING FOR SEALED SEMICONDUCTOR DEVICE

(75) Inventor: Hiroaki Narita, Tsuruta-machi (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/559,397

(22) Filed: Jul. 26, 2012

(65) Prior Publication Data

US 2013/0040426 A1 Feb. 14, 2013

(30) Foreign Application Priority Data

Aug. 8, 2011 (JP) ................. 2011-172907

(51) Int. Cl.
*H01L 21/78* (2006.01)
(52) U.S. Cl.
USPC ............................ 438/113; 438/110; 438/460
(58) Field of Classification Search
USPC .......................................................... 438/113
See application file for complete search history.

(56) References Cited

FOREIGN PATENT DOCUMENTS

| JP | 2002-076040 A | 3/2002 |
|---|---|---|
| JP | 2005-294443 A | 10/2005 |
| JP | 2009-076717 A | 4/2009 |

*Primary Examiner* — Telly Green
*Assistant Examiner* — Damian A Hillman
(74) *Attorney, Agent, or Firm* — Womble Carlyle

(57) ABSTRACT

A method for forming a sealing body without cracks in manufacture of a semiconductor device having an external terminal formed through the use of an electrolysis plating method. A front surface of a semiconductor wafer is placed over a front surface of a first support heated to a first temperature. An adhesive sheet is then bonded to a back surface of the semiconductor wafer, after which the semiconductor wafer is subjected to heat treatment at a second temperature higher than the first temperature. After the semiconductor wafer and the adhesive sheet are cut along cutting regions, a plurality of semiconductor chips each having an adhesive patch bonded thereto are obtained. A mother substrate is placed over a front surface of a second support heated to a third temperature and the semiconductor chips are fixed to an upper surface of the mother substrate via the adhesive patch.

33 Claims, 26 Drawing Sheets

MANUFACTURING METHOD USING MULTI-STEP ADHESIVE CURING FOR SEALED SEMICONDUCTOR DEVICE

CROSS-REFERENCE TO RELATED APPLICATION

The disclosure of Japanese Patent Application No. 2011-172907 filed on Aug. 8, 2011 including the specification, drawings and abstract is incorporated herein by reference in its entirety.

BACKGROUND

The present invention relates to a manufacturing technology of a semiconductor device, and in particular, to an effective technology applied to manufacture of a semiconductor device having a package structure in which a semiconductor chip is sealed by a resin sealing body, and in which an external terminal electrically coupled to an electrode pad formed on a front surface of the semiconductor chip is exposed from a lower surface of the resin sealing body.

For example, Japanese Patent Laid-Open No. 2002-76040 (Patent Document 1) discloses a semiconductor device which has: a semiconductor chip; a plurality of electrode members; a plurality of coupling means which electrically couples a plurality of electrodes on a front surface of the semiconductor chip and the electrode members; and a resin sealing body which seals the semiconductor chip, the electrode members, and the coupling means, and in which a back surface of the semiconductor chip and the electrode members are exposed from a lower surface of the resin sealing body.

In addition, Japanese Patent Laid-Open No. 2005-294443 (Patent Document 2) discloses a semiconductor device in which an external terminal and a semiconductor chip which have been fabricated from a lead frame are electrically coupled to each other with a wire, and sealed with sealing resin, and in which an insulating resin layer is previously formed by coating or the like in contact with a back surface of the semiconductor chip, and in which the insulating resin layer is exposed at a lower surface side of the sealing resin, and exists over a same plane as a lower surface of the external terminal.

In addition, Japanese Patent Laid-Open No. 2009-76717 (Patent Document 3) discloses a technology in which a structure body having a lead electrode and a tab electrode is formed on an upper surface of a stainless steel plate by electroplating, the structure body including a nickel layer as a principal component, and in which subsequently, the above-described structure body is peeled off from the stainless steel plate.

Along with reduction in size and reduction in thickness of electronic equipments, reduction in size and reduction in thickness have been requested also in semiconductor devices (semiconductor packages) mounted in the electronic equipments.

In order to achieve reduction in size and reduction in thickness of a semiconductor device, for example, as shown in FIG. 3 in Japanese Patent Laid-Open No. 2002-76040, a structure is considered to be effective in which a die pad (a tab and chip mounting portion) for supporting a semiconductor chip is eliminated.

However, since the back surface of the semiconductor chip mounted in the semiconductor device is exposed from the sealing body in the above-described structure, a load (stress) is applied to the semiconductor chip, and a crack is easily generated in the semiconductor chip. If a thickness of the semiconductor chip is large, a serious problem does not occur even if slight loads are applied to the semiconductor chip, but the thickness of the semiconductor chip also tends to be smaller when there is a reduction in size and reduction in thickness of the semiconductor device. Therefore, in the semiconductor device in which reduction in size and reduction in thickness have progressed, there is a possibility that reliability of the semiconductor device is decreased due to the slight loads being applied to the semiconductor chip. In addition, when the back surface of the semiconductor chip is exposed from the sealing body, there is also a possibility that moisture enters from an interface of the sealing body and the semiconductor chip, and that reliability of the semiconductor device is decreased due to the moisture.

Consequently, the inventor of the present application has examined a manufacturing method for arranging a semiconductor chip over a mother substrate via an insulating resin layer (an adhesive film, an adhesive, an adhesive layer, or a sealing material) as shown in FIG. 2 in the above-described Japanese Patent Laid-Open No. 2005-294443. According to such manufacturing method, a back surface of the semiconductor chip can be protected since the insulating resin layer is placed on the back surface of the semiconductor chip. In addition, in accordance with such manufacturing method, since the die pad can be eliminated, it becomes possible to balance elimination of a die pad and protection of the back surface of the semiconductor chip. Accordingly, the above-described manufacturing method has been considered to be effective since not only reduction in size and reduction in thickness of the semiconductor device can be achieved, but also decrease in reliability of the semiconductor device can be suppressed.

However, the inventor of the present application has considered that it is necessary to make smaller a thickness of a lead used as an external terminal in order to achieve further reduction in size of the semiconductor device, and has examined the external terminal formed by using an electrolysis plating method as in the above-described Japanese Patent Laid-Open No. 2009-76717. Therefore, it has been found that the external terminal can be formed with a thickness approximately not more than half of the thickness of the lead including a part of a lead frame formed by patterning a conductive substrate as in the above-described Japanese Patent Laid-Open No. 2005-294443 by using the electrolysis plating method.

Incidentally, when an external terminal is formed by using the electrolysis plating method, a base material including a metal is used as a mother substrate. Therefore, after a sealing body which covers a semiconductor chip etc. is formed, the mother substrate has to be peeled off from the sealing body. However, as a result of examination by the inventor of the present application, a new problem has occurred that when a part of an insulating resin layer protrudes from a side surface of the semiconductor chip in a planar view, the part of the insulating resin layer protruding from the side surface of the semiconductor chip remains on the mother substrate at the time of peeling off the mother substrate from the sealing body, and cracks are generated on a part of a lower surface of the sealing body. This is because adhesion of the mother substrate including the metal to the insulating resin layer is larger than adhesion of the sealing body to the insulating resin layer. If there are cracks in the sealing body as described above, there has been concern that moisture enters into an interface of the sealing body and the semiconductor chip from the cracked portion, and reliability of the semiconductor device is decreased due to the moisture.

SUMMARY

Consequently, the present invention discloses a technology in which a sealing body without cracks on a lower surface thereof can be formed by causing an insulating resin layer not to protrude from a side surface of a semiconductor chip in a planar view although an external terminal is formed through the use of the electrolysis plating method in which a base material including a metal is used as a mother substrate (metallic mother substrate) in order to enhance reduction in size and reduction in thickness of a semiconductor device.

The present invention has been made in view of the above circumstances and provides a technology capable of forming a sealing body without cracks in manufacture of a semiconductor device having an external terminal formed using the electrolysis plating method.

In addition, another object of the present invention is to provide a technology which can suppress decreased reliability of a semiconductor device and can enhance reduction in size and reduction in thickness of the semiconductor device.

The other purposes and the new feature of the present invention will become clear from the description of the present specification and the accompanying drawings.

The following explains briefly one embodiment of a typical invention among the inventions disclosed in the present application.

The embodiment is a manufacturing method of a semiconductor device including the following steps of: (a) preparing a semiconductor wafer having a first principal surface, a plurality of chip regions provided on the first principal surface, a cutting region provided between mutually adjacent chip regions of the chip regions, and a second principal surface on the side opposite to the first principal surface; (b) arranging the semiconductor wafer on a front surface of a first support heated to a first temperature so that the first principal surface of the semiconductor wafer faces the front surface of the first support, and bonding a film-like adhesive sheet to the second principal surface of the semiconductor wafer in a state where heat has been applied to the semiconductor wafer; (c) applying a second temperature higher than the first temperature to the semiconductor wafer having the adhesive sheet bonded thereto; (d) cutting the semiconductor wafer and the adhesive sheet along the cutting region, and obtaining the semiconductor chip having an adhesive patch bonded thereto (the term "adhesive patch" referring a part of the adhesive sheet that remains bonded to an individual semiconductor chip after cutting a wafer having the adhesive sheet bonded thereto; (e) arranging the semiconductor chip on an upper surface of a mother substrate including a metal (metallic mother substrate), the mother substrate being placed on a front surface of a second support heated to a third temperature, via the adhesive patch, and fixing the semiconductor chip to the upper surface of the mother substrate; (f) electrically coupling an electrode pad of the semiconductor chip and an external terminal of the mother substrate via a conductive member; (g) forming a sealing body by sealing with resin the semiconductor chip, the adhesive patch, and the upper surface of the mother substrate; and (h) peeling off the mother substrate from the sealing body, and exposing a back surface of the adhesive patch from the sealing body.

The following explains briefly the effect acquired by one embodiment of a typical invention among the inventions disclosed in the present application.

A sealing body without cracks can be formed in manufacture of a semiconductor device having an external terminal formed using the electrolysis plating method. In addition, decrease in reliability of the semiconductor device can be suppressed, and reduction in size and reduction in thickness of the semiconductor device can be achieved.

DETAILED DESCRIPTION

Figure 1:
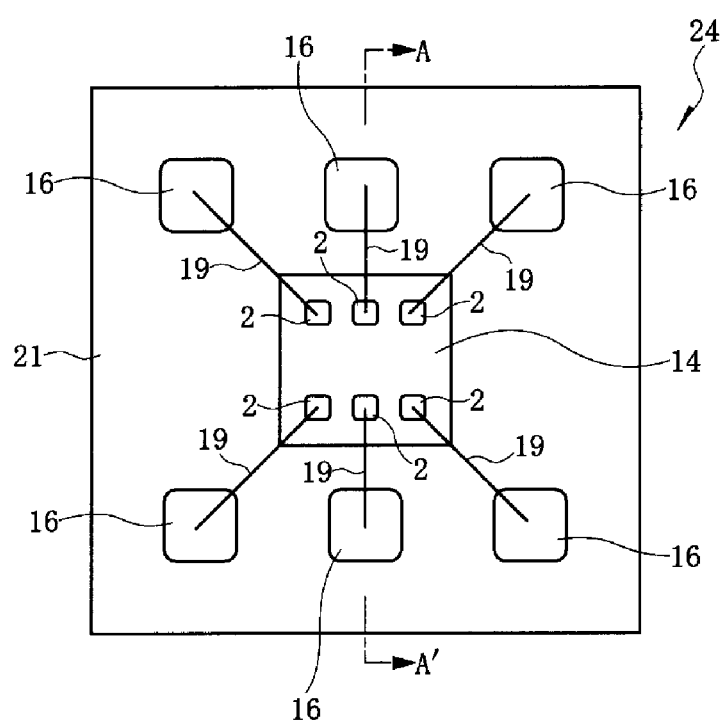
FIG. 1 is a main part plan view seen through a resin sealing body of a semiconductor device according to an embodiment of the present invention.

The following embodiment will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiment, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically. Furthermore, in the following embodiment, it is needless to say that an element (including an element step etc.) is not necessarily indispensable, except for the case where it is clearly specified in particular and where it is considered to be clearly indispensable from a theoretical point of view, etc. Similarly, in the following embodiment, when referring to shape, position relationship, etc. of an element etc., what resembles or is similar to the shape substantially shall be included, except for the case where it is clearly specified in particular and where it is considered to be clearly not right from a theoretical point of view. This statement also applies to the numeric value and range described above.

In addition, in the drawings used in the following embodiment, in order to make a drawing intelligible, hatching may be attached even if it is a plan view. In addition, in the following embodiment, a wafer mainly indicates a Si (Silicon) single crystal wafer, but is not limited to this, and it shall indicate an SOI (Silicon On Insulator) wafer, an insulating film substrate for forming an integrated circuit over it, etc. A shape of the wafer is also not only a circle or a substantial circle, but shall include a square, a rectangle, etc.

In addition, in all the drawings for explaining the following embodiment, the same symbol is attached to a member having the same function, as a principle, and the repeated explanation thereof is omitted. Hereinafter, the embodiment of the present invention will be described in detail based on the drawings.

Embodiment

Regarding Semiconductor Device

Figure 2:
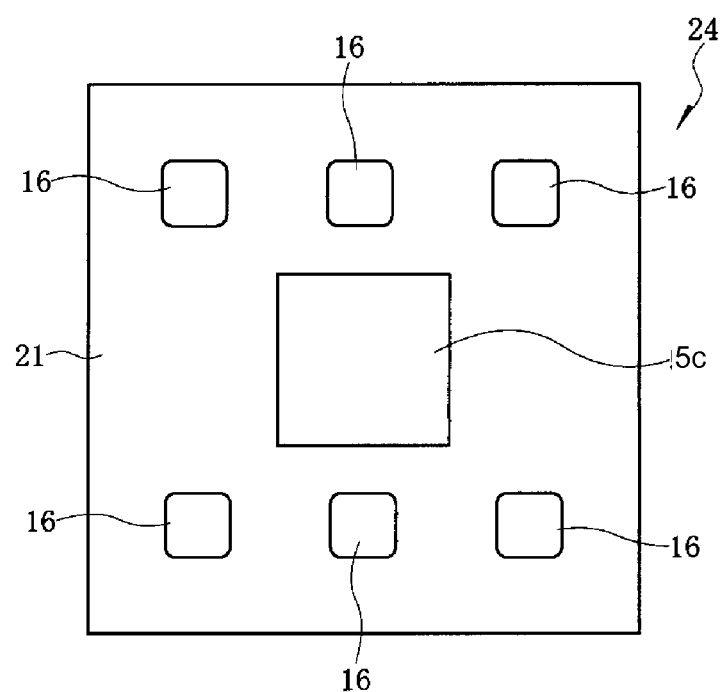
FIG. 2 is a main part plan view of a back surface (mounting surface) side of the semiconductor device according to the embodiment of the present invention.
Figure 3:
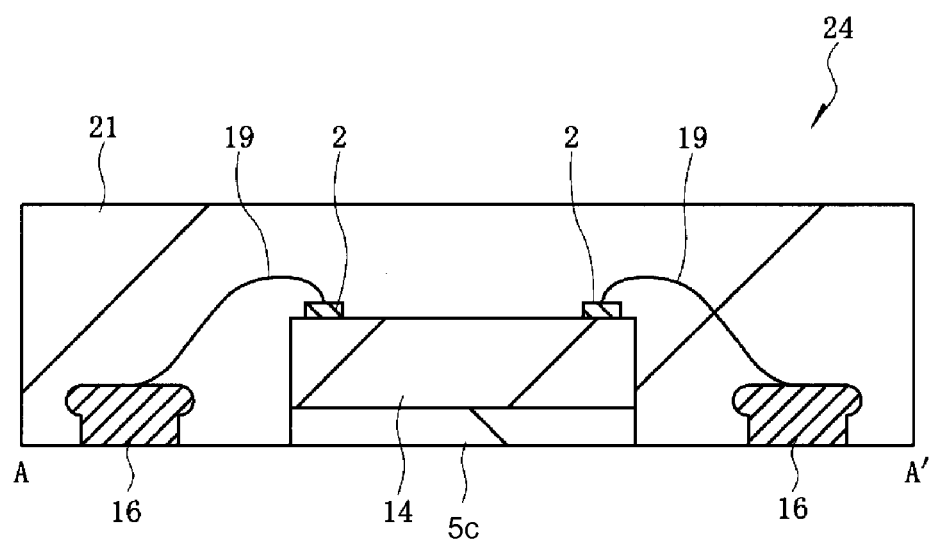
FIG. 3 is a main part cross-sectional view of the semiconductor device taken along a line A-A' shown in FIG. 1.

A semiconductor device according to the embodiment of the present invention will be described by using FIGS. 1 to 3. FIG. 1 is a main part plan view of the semiconductor device seen through a resin sealing body, FIG. 2 is a main part plan view of a back surface (mounting surface) side of the semiconductor device, and FIG. 3 is a main part cross-sectional view of the semiconductor device taken along a line A-A' shown in FIG. 1.

A semiconductor device (semiconductor package) 24 includes: a semiconductor chip 14; an adhesive patch (an adhesive portion, or a sealing material) 5 formed on a back surface of the semiconductor chip 14; a plurality of external terminals (electrodes) 16 provided around the semiconductor chip 14; and a plurality of conductive members 19 which electrically couples a plurality of electrode pads (bonding pads) 2 arranged on a front surface of the semiconductor chip 14 and the external terminals 16. In addition, the semiconductor chip 14, a side surface of the adhesive patch 5c, parts (upper surfaces and side surfaces) of the respective external terminals 16, and the conductive members 19 are sealed by a resin sealing body (sealing body) 21. However, the semiconductor device 24 has a structure in which the back surface of the semiconductor chip 14 is not exposed from a lower surface of the resin sealing body 21, and in which a lower surface of the adhesive patch 5c adhering to the back surface of the semiconductor chip 14 and the other parts (lower surfaces (mounting surfaces)) of the respective external terminals 16 are exposed therefrom.

As described above, reduction in size and reduction in thickness of the semiconductor device 24 can be achieved by not arranging a die pad on the back surface of the semiconductor chip 14 and further, by using the external terminals 16 formed with an electrolysis plating method. In addition, since the back surface of the semiconductor chip 14 is protected by the adhesive patch 5c, and moisture intrusion into the semiconductor chip 14 can also be suppressed, decrease in reliability of the semiconductor device 24 can also be suppressed.

Regarding Manufacturing Method of Semiconductor Device

Figure 11:
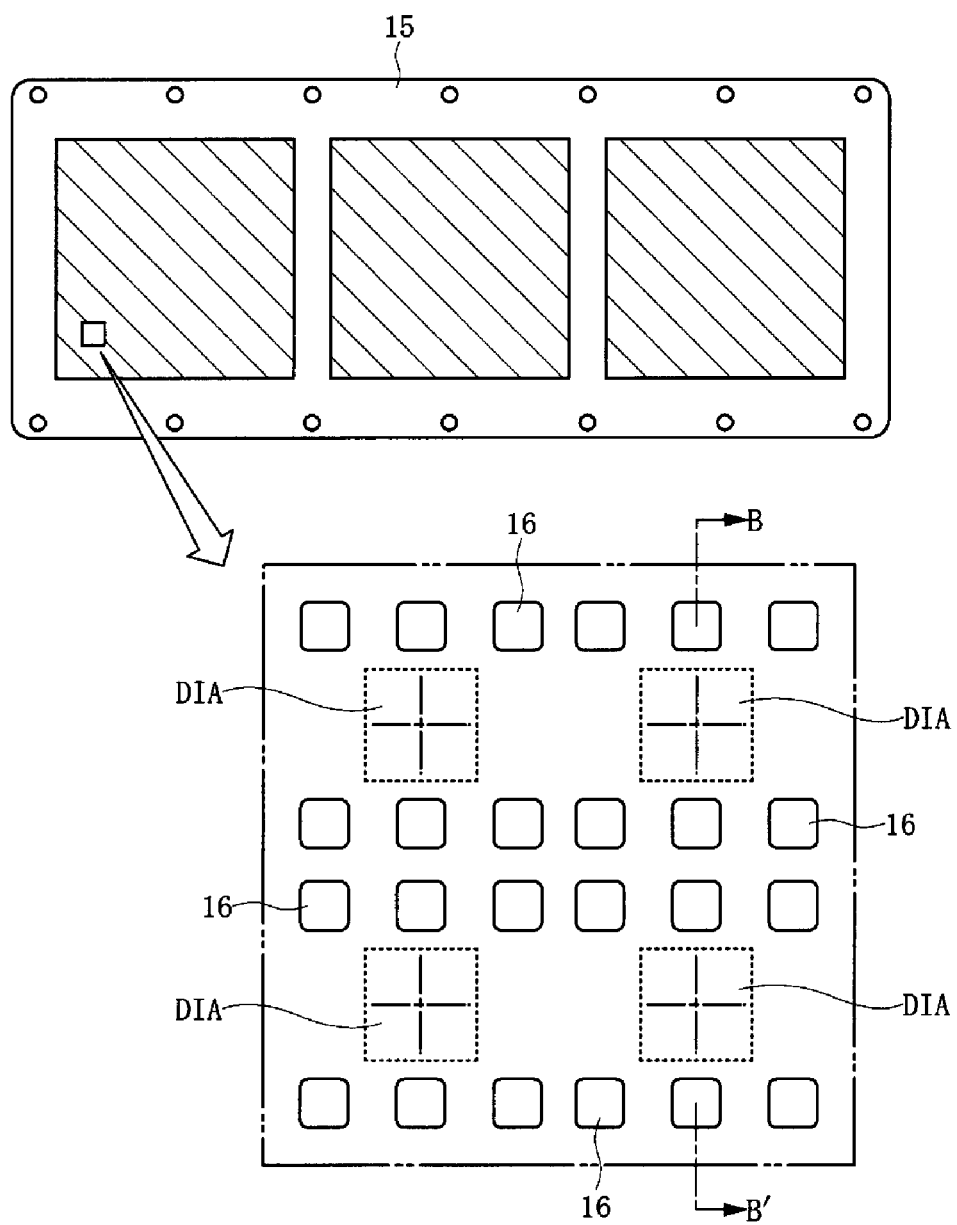
FIG. 11 is a main part plan view of a mother substrate during a manufacturing process of the semiconductor device subsequent to FIG. 10.
Figure 12:
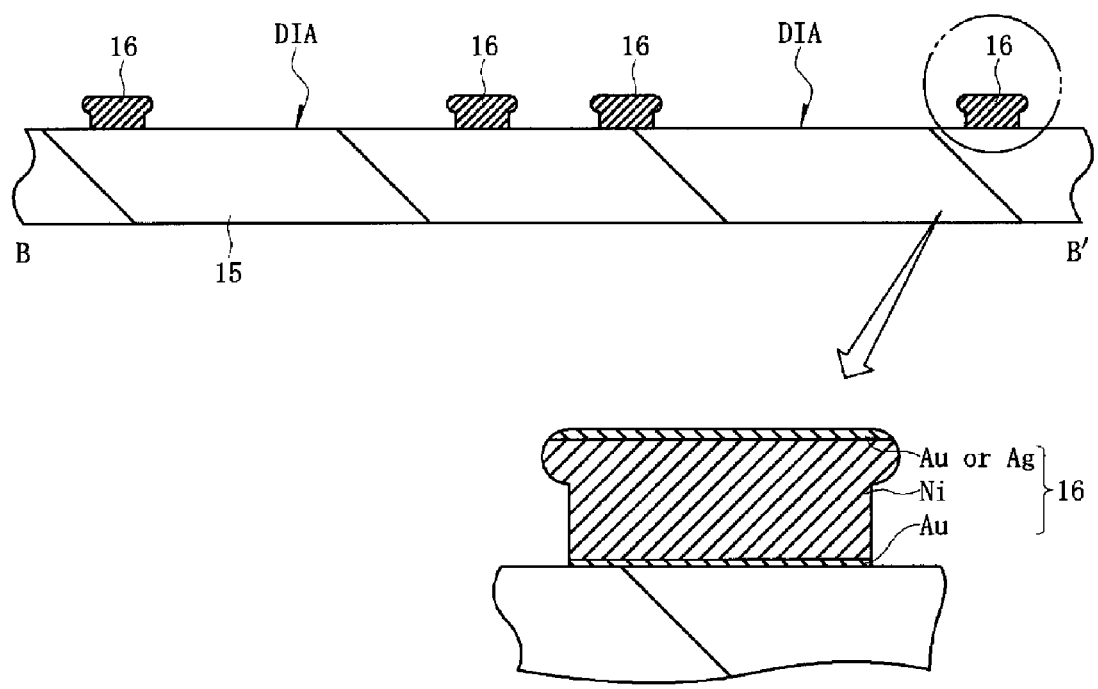
FIG. 12 is a main part cross-sectional view of the mother substrate taken along a line B-B' shown in FIG. 11.
Figure 15A:
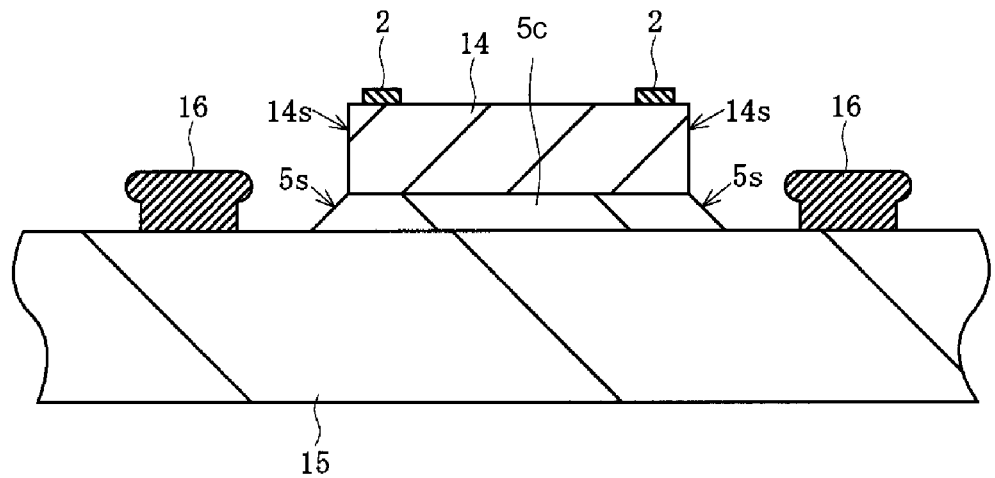
FIGS. 15A and 15B are main part cross-sectional views of the semiconductor device illustrating a state where a semiconductor chip and the mother substrate are not connected well (poor transfer state of the adhesive)
Figure 15B:
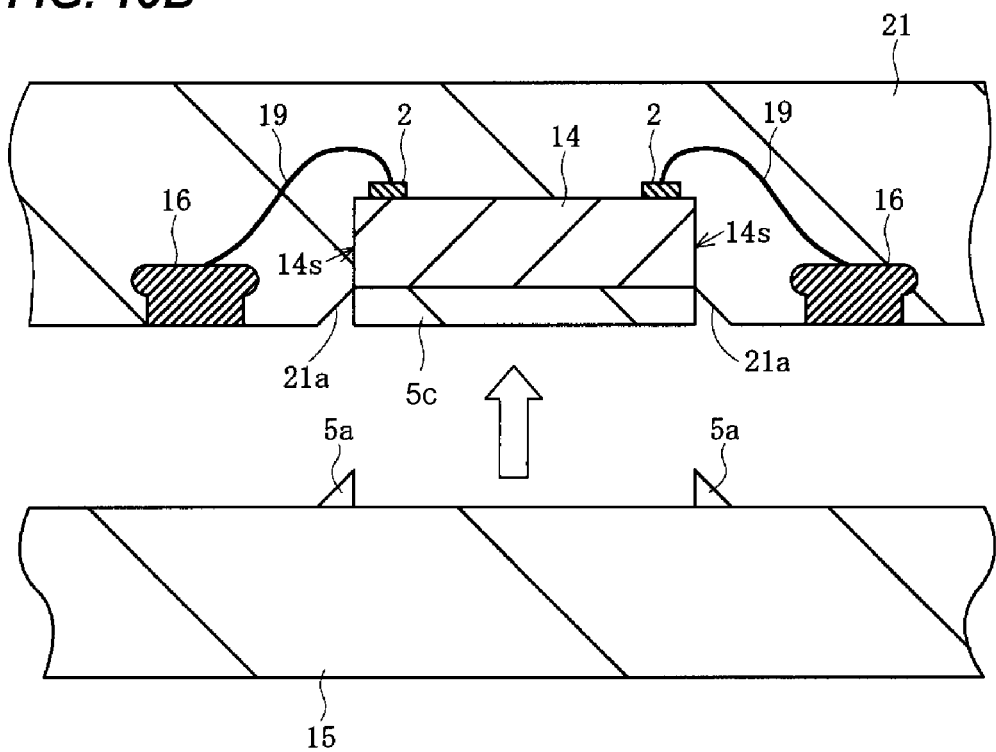
Figure 16A:
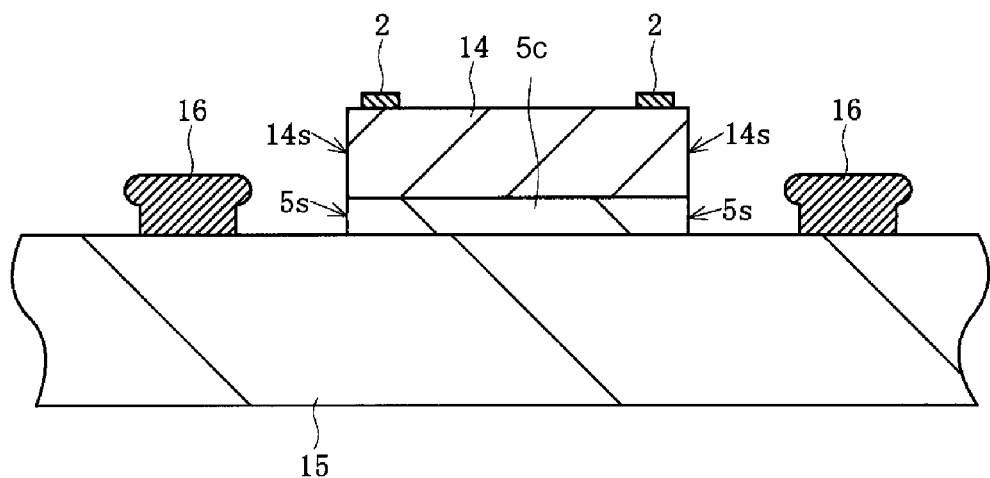
FIGS. 16A and 16B are main part cross-sectional views of semiconductor devices of a first example and a second example illustrating a state where the semiconductor chip and the mother substrate are connected well, respectively.
Figure 16B:
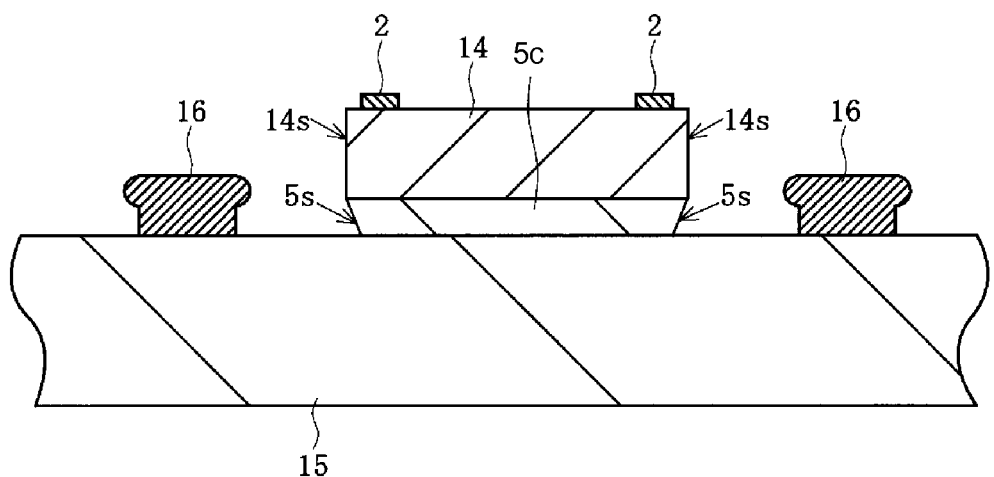
Figure 17:
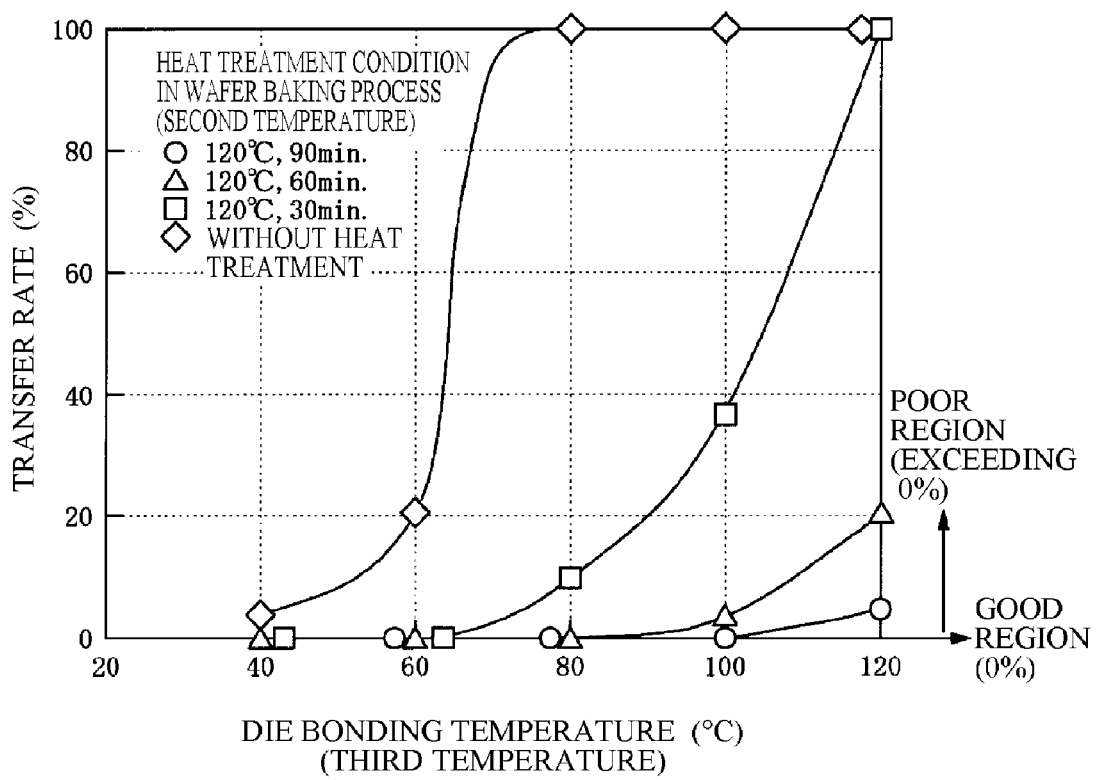
FIG. 17 is a graph chart illustrating a relation between an adhesive transfer rate and a heat treatment temperature (third temperature) in a die bonding process, setting as a parameter heat treatment conditions in the wafer baking process according to the embodiment of the present invention.
Figure 18:
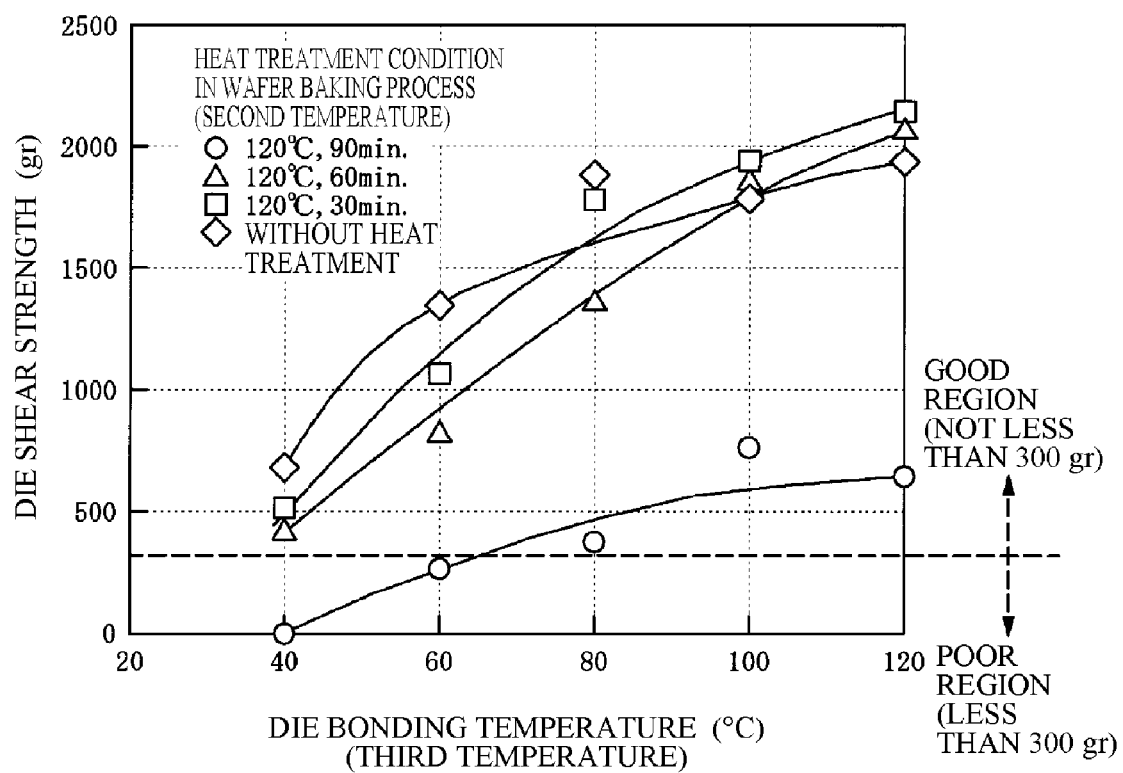
FIG. 18 is a graph chart illustrating a relation between a die shear strength and the heat treatment temperature (third temperature) in the die bonding process, setting as the parameter the heat treatment conditions in the wafer baking process according to the embodiment of the present invention.

Next, a manufacturing method of the semiconductor device according to the embodiment of the present invention will be described in order of process by using FIGS. 4 to 27. FIGS. 4 to 7, FIG. 9, FIG. 10, FIG. 13, FIG. 14, and FIGS. 19 to 26 are main part cross-sectional views of the semiconductor device during manufacturing processes illustrating the manufacturing method of the semiconductor device, FIG. 8 is a graph chart illustrating a relation between an adhesive curing rate and a heat treatment time, setting as a parameter a heat treatment temperature (second temperature) in a wafer baking process, FIG. 11 is a main part plan view of a mother substrate during a manufacturing process illustrating the manufacturing method of the semiconductor device, FIG. 12 is a main part cross-sectional view of the mother substrate taken along a line B-B' shown in FIG. 11, FIGS. 15A and 15B are main part cross-sectional views of the semiconductor device illustrating a state where a semiconductor chip and the mother substrate are not coupled well (poor transfer state of an adhesive), FIG. 16 is a main part cross-sectional view of the semiconductor device illustrating a state where the semiconductor chip and the mother substrate are coupled well, FIG. 17 is a graph chart illustrating a relation between an adhesive transfer rate and a heat treatment temperature (third temperature) in a die bonding process, setting, as a parameter, heat treatment conditions in the wafer baking process, FIG. 18 is a graph chart illustrating a relation between a die shear strength and the heat treatment temperature (third temperature) in the die bonding process, setting, as the parameter, the heat treatment conditions in the wafer baking process, and FIG. 27 is a process chart illustrating the manufacturing method of the semiconductor device.

Wafer Preparation Process P1

Figure 4:
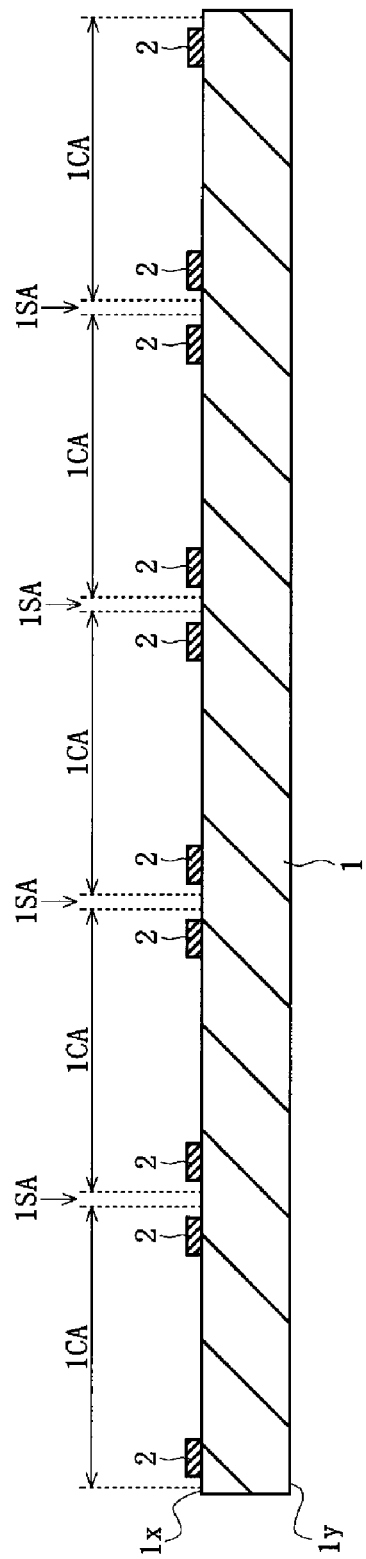
FIG. 4 is a main part cross-sectional view of the semiconductor device during a manufacturing process illustrating a manufacturing method of the semiconductor device according to the embodiment of the present invention.

First, a semiconductor wafer 1 is prepared as shown in FIG. 4. The semiconductor wafer 1 includes a single crystal silicon, a diameter thereof is, for example, 200 mm or 300 mm, and a thickness (first thickness) thereof is, for example, not less than 0.7 mm (a value at the time of input in the manufacturing process). The semiconductor wafer 1 has: a first principal surface (front surface) 1x; a plurality of chip regions 1CA partitioned to be formed in a matrix form on the first principal surface 1x; a cutting region (a scribe region, a dicing region, or a dicing line) 1SA formed between the mutually adjacent chip regions 1CA of the chip regions 1CA; and a second principal surface (back surface) 1y on the side opposite to the first principal surface 1x.

In each chip region 1CA on the first principal surface 1x of the semiconductor wafer 1, there is formed an integrated circuit including, but not limited to these: a plurality of semiconductor elements; a multilayer wiring layer in which a plurality of insulating layers and wiring layers is respectively stacked; and a surface protection film formed so as to cover the multilayer wiring layer. The above-described insulating layer is, for example, formed of a silicon oxide film. The above-described wiring layer is, for example, formed of a metal film such as aluminum, tungsten, or copper. The above-described surface protection film is formed of a multilayer film in which an inorganic insulating film, such as a silicon oxide film or a silicon nitride film, and an organic insulating film are stacked. In addition, in each chip region 1CA on the first principal surface 1x of the semiconductor wafer 1, the electrode pads (bonding pads) 2 electrically coupled to the above-described semiconductor elements are arranged along each side of the each chip region 1CA (a part of the electrode pads 2 is depicted in FIG. 1). These electrode pads 2 include wiring of an uppermost layer of the above-described multilayer wiring layer, and are exposed from openings formed corresponding to the respective electrode pads 2 in the above-described surface protection film.

Back Grinding Process P2

Next, the second principal surface 1y of the semiconductor wafer 1 is roughly ground through the use of an abrasive (for example, roughness #360) after a protection tape (back grinding tape) which covers the integrated circuit is bonded at a first principal surface 1x side of the semiconductor wafer 1, whereby a thickness of the semiconductor wafer 1 is thinned to a predetermined thickness. Subsequently, the second principal surface 1y of the semiconductor wafer 1 is finish-ground through the use of an abrasive (for example, roughness #1500 or #2000) finer than the previously used abrasive, whereby distortion of the second principal surface 1y of the semiconductor wafer 1 caused at the time of rough grinding is removed (back grinding). Furthermore, a polishing streak of the second principal surface 1y of the semiconductor wafer 1 caused at the time of finish grinding is removed, for example by a spin etching method, a CMP (Chemical Mechanical Polishing) method, etc. (stress relief). A thickness (second thickness) of the semiconductor wafer 1 at the time when the above-described back grinding and stress relief are completed is, for example, 0.13 mm. It should be noted that the above-described stress relief is not necessary to be performed to all the semiconductor wafers 1, and that it is performed depending on a strength required for the semiconductor chip.

Adhesive Bonding Process (First Temperature) P3

Figure 5:
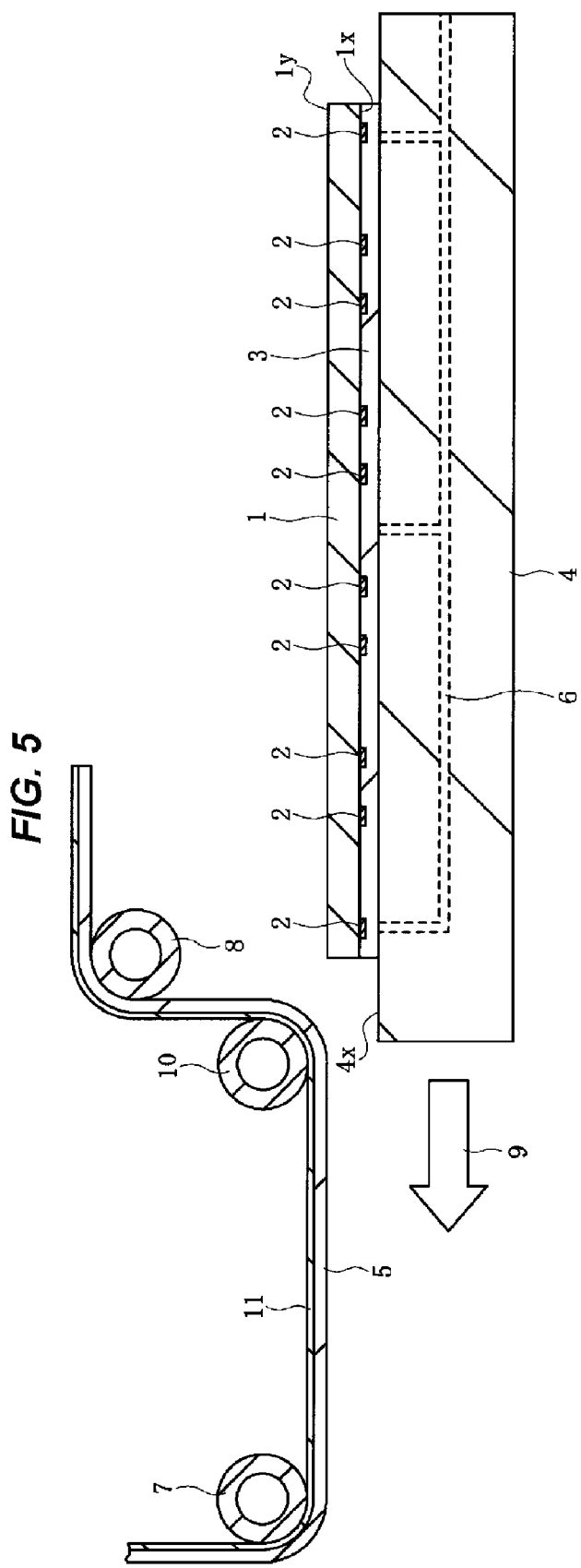
FIG. 5 is a main part cross-sectional view of the semiconductor device and an adhesive bonding device during a manufacturing process of the semiconductor device subsequent to FIG. 4.
Figure 6:
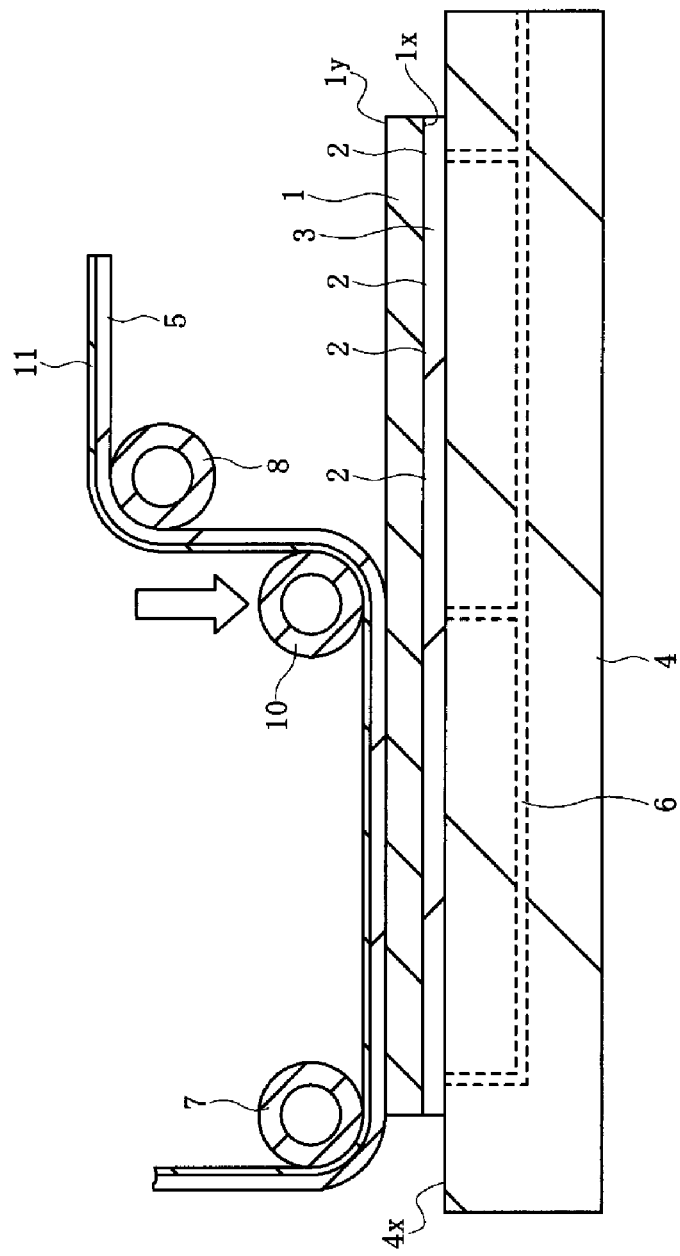
FIG. 6 is a main part cross-sectional view of the semiconductor device and the adhesive bonding device during a manufacturing process of the semiconductor device subsequent to FIG. 5.

Next, as shown in FIGS. 5 and 6, the film-like adhesive sheet (the adhesive film, the adhesive layer, or the sealing material) 5 is bonded to the second principal surface 1y of the semiconductor wafer 1. The adhesive sheet 5, or more specifically, a part thereof, functions as the adhesive patch at the time of fixing the semiconductor chip to an upper surface of the metallic mother substrate in a later manufacturing process, and further functions as a sealing material for protecting a back surface of the semiconductor chip after a semiconductor device is completed. The adhesive sheet 5 is, for example, a heat-cured type, and includes epoxy-based resin containing filler (particles of $SiO_2$). A thickness of the adhesive sheet 5 is, for example, 20 to 30 μm and is preferred to be in a peripheral range in which a central value is 25 μm. In addition, a filler content of the adhesive sheet 5 is, for example, 60 wt %.

Bonding of the adhesive sheet 5 to the second principal surface 1y of the semiconductor wafer 1 is performed specifically as follows.

First, as shown in FIG. 5, a front protection tape 3 is applied at the first principal surface 1x side of the semiconductor wafer 1. Then, the first principal surface 1x of the semiconductor wafer 1 and a front surface (an upper surface or a wafer mounting surface) 4x of a first support 4 having a heat source are caused to face each other, and the semiconductor wafer 1 is placed over the front surface 4x of the first support 4. The semiconductor wafer 1 is vacuum-sucked via a vacuum path 6 provided inside the first support 4, and is fixed over the front surface 4x of the first support 4. In addition, the first support 4 is heated to the first temperature (for example, 80 to 100° C.), and heat of the first support 4 also is transferred to the semiconductor wafer 1 placed over the front surface 4x of the first support 4. As a result, the semiconductor wafer 1 is heated to a temperature equal to the above-described first temperature. In the state where heat has been applied to the semiconductor wafer 1, the film-like adhesive sheet 5 is bonded to the second principal surface 1y of the semiconductor wafer 1.

Next, the first support 4 is moved in a direction of an arrow 9 shown in FIG. 5 toward the adhesive sheet 5 stretched by positioned first fixing roller 7 and second fixing roller 8. A moving speed of the first support 4 is, for example, 5 mm/sec.

Next, as shown in FIG. 6, a pressure is applied between the adhesive sheet 5 and the second principal surface 1y of the semiconductor wafer 1 by a pressure roller 10. More particularly, the adhesive sheet 5 is pressed against the second principal surface 1y of the semiconductor wafer 1. As heat and pressure are applied, the pressure roller 10 first rolls over a first part of a periphery of the semiconductor wafer 1, then rolls over a central part of the semiconductor wafer 1 and finally rolls over an opposite second part of the periphery of the semiconductor wafer 4 to thereby gradually cause the adhesive sheet 5 to adhere to the second principal surface 1y of the semiconductor wafer 1. In this manner, eventually, the adhesive sheet 5 is bonded to the entire second principal surface 1y of the semiconductor wafer 1. A predetermined tension is applied to the adhesive sheet 5 before it is bonded to the semiconductor wafer 1. This allows the adhesive sheet 5 to bond, without wrinkles and with a uniform thickness, to the second principal surface 1y of the semiconductor wafer 1. In addition, on one surface of the adhesive sheet 5, which is the surface of the side in contact with the pressure roller 10 (surface on the side opposite to a surface in contact with the second principal surface 1y of the semiconductor wafer 1), a back protection sheet 11 for protecting the adhesive sheet 5 is provided. Thus, at this point the semiconductor wafer assembly includes the back protection sheet 11, the adhesive sheet 5, the wafer 1 and the front protection tape 3.

A temperature of the first fixing roller 7, the second fixing roller 8, and the pressure roller 10 is a room temperature. In addition, a temperature of the adhesive sheet 5 before being bonded to the second principal surface 1y of the semiconductor wafer 1, and of the back protection sheet 11 is also the room temperature. However, heat (for example, 80 to 100° C.) of the semiconductor wafer 1 transfers to the adhesive sheet 5 at the moment when the adhesive sheet 5 gets into contact with the semiconductor wafer 1, and the adhesive sheet 5 melts to have a strong adhesive force to the wafer's second principal surface 1y, even though the adhesive sheet 5 is still in an uncured state (a first shape). Here, if the temperature of the adhesive sheet 5 is low, for example, 40 to 50° C., it becomes difficult for the adhesive sheet 5 to melt, and an adhesive force between the semiconductor wafer 1 and the adhesive sheet 5 becomes weak. When the adhesive force of the semiconductor wafer 1 and the adhesive sheet 5 becomes weak, semiconductor chips peel off from the adhesive patch 5c to cause a problem of scattering of the semiconductor chips, etc. in a manufacturing process of individually dividing the semiconductor wafer 1 into the semiconductor chips (wafer dicing process P6).

Wafer Baking Process (Second Temperature) P4

Figure 7:
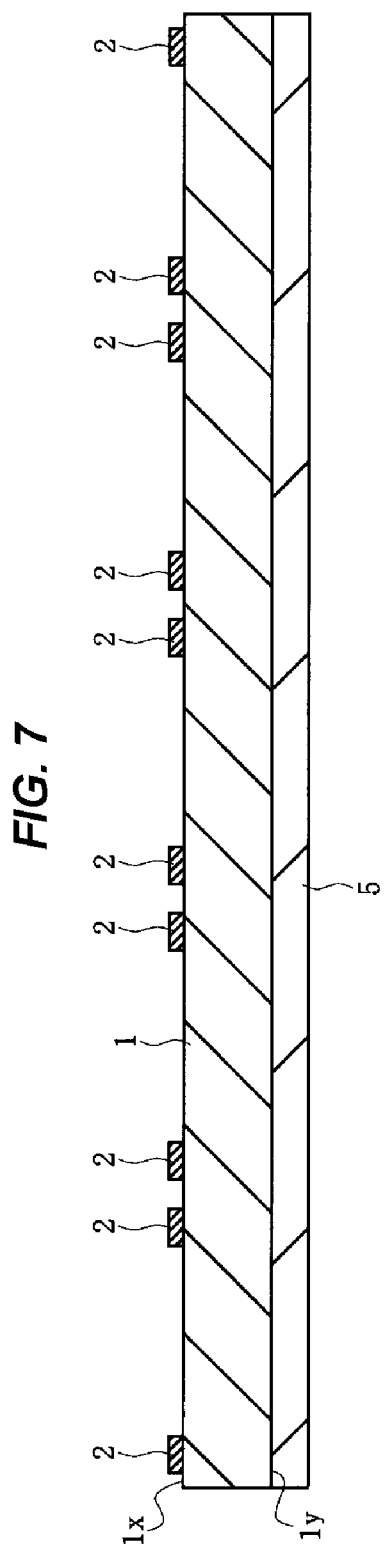
FIG. 7 is a main part cross-sectional view of the semiconductor device during a manufacturing process of the semiconductor device subsequent to FIG. 6.
Figure 8:
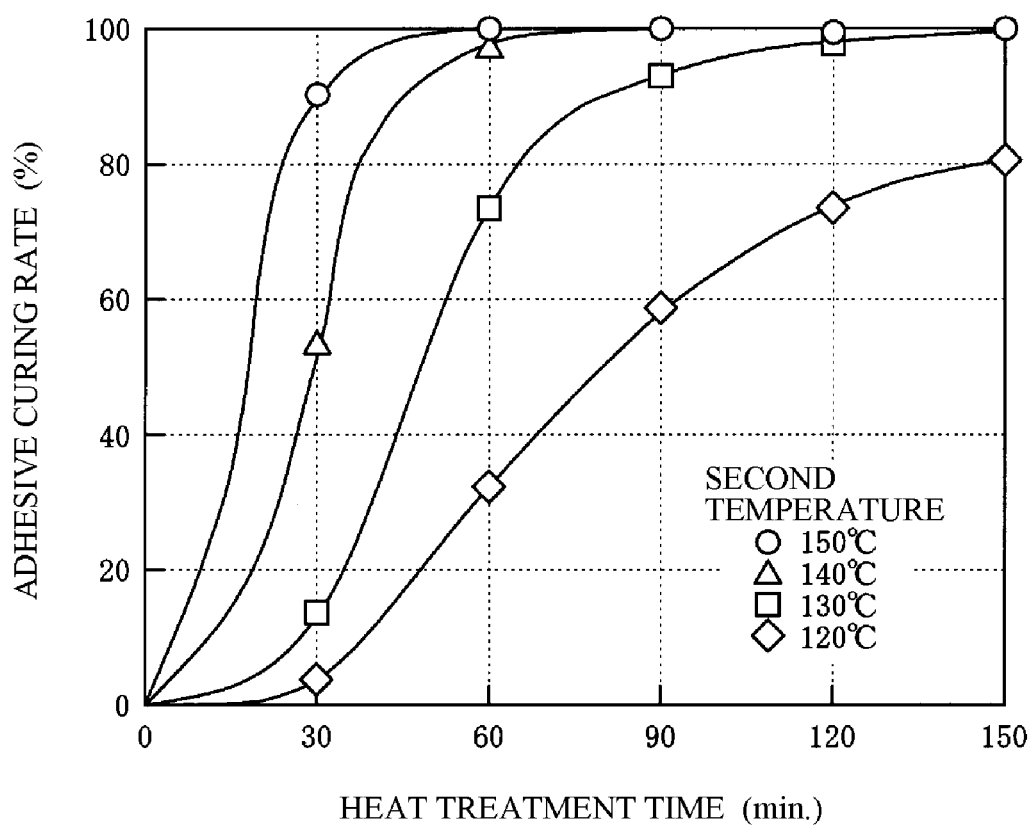
FIG. 8 is a graph chart illustrating a relation between an adhesive curing rate and a heat treatment time, setting as a parameter a heat treatment temperature (second temperature) in a wafer baking process according to the embodiment of the present invention.

Next, as shown in FIG. 7, after the front protection tape 3 and the back protection sheet 11 are removed, heat treatment is performed to the semiconductor wafer 1 having the adhesive sheet 5 bonded thereto at a second temperature that is higher than the first temperature, and without applying pressure (e.g., without further pressing the adhesive sheet 5 against the second principal surface 1y). For example, the treatment may be performed for approximately 60 minutes at the second temperature of 120°, without applying a pressure. The heat treatment is air baking using, for example, a baking furnace (heated chamber in which the semiconductor wafer 1 having the adhesive sheet 5 bonded thereto is stored). Because of this, a curing reaction of the adhesive sheet 5 is promoted, and the adhesive sheet 5 is put into a partially-cured state (second shape) from the uncured state (first shape). In the partially-cured state, the adhesive sheet is generally 30%-65% cured, but more preferably is about 50% cured ("half-cured"). Since the pressure is not applied to the adhesive sheet 5 in the heat treatment, deformation of the adhesive sheet 5 can be suppressed.

Since the adhesive patch 5c on the semiconductor chip 14 does not become soft in a manufacturing process of placing the semiconductor chip 14 on the upper surface of the mother substrate (die bonding process P7, discussed below), when the adhesive patch 5c is completely cured the adhesive force of the semiconductor chip and the mother substrate becomes weak and it becomes difficult to adhere the semiconductor chip to the upper surface of the mother substrate, unless the semiconductor chip's adhesive patch 5c is first partially cured at an earlier point in time, such as when it formed part of the adhesive sheet 5 bonded to the semiconductor wafer 1. Accordingly, it is important to properly set heat treatment conditions (the heat treatment temperature (second temperature) and a heat treatment time) in the wafer baking process P4 so that the adhesive sheet 5 is partially cured.

In FIG. 8, shown is a graph chart illustrating a relation between an adhesive curing rate and a heat treatment time, setting the heat treatment temperature (second temperature) as a parameter.

As shown in FIG. 8, the higher the heat treatment temperature (second temperature), the higher the curing speed. Accordingly, although a time required for heat treatment becomes longer, the lower the heat treatment temperature (second temperature) becomes, the easier control of the curing rate of the adhesive sheet 5 becomes. Thus, as seen in FIG. 8, the time-adhesive curing rate curve for a second temperature of 120° C. has the largest slope and so the curing rate is easiest to control at this temperature. Although heat treatment conditions also depend on the uncured state of the adhesive sheet 5 before heat treatment is performed, it is considered that a peripheral range whose central values are the second temperature of 120° C. and the second heat treatment time of 60 minutes is the most preferred heat treatment condition for the wafer baking process P4, after the adhesive sheet 5 has been bonded to the second principal surface 1y of the semiconductor wafer 1, for example, at the first temperature of 80 to 100° C. in the adhesive bonding process P3, which is the previous manufacturing process. As one example of a peripheral range, the wafer baking process may be conducted at a second temperature range of between 115° C. and 125° C. for a time range of between 45 and 75 minutes, which time range corresponds to the linear portion of the time-adhesive curing rate curve for a second temperature of 120° C. in FIG. 8.

Dicing Tape Bonding Process P5

Figure 9:
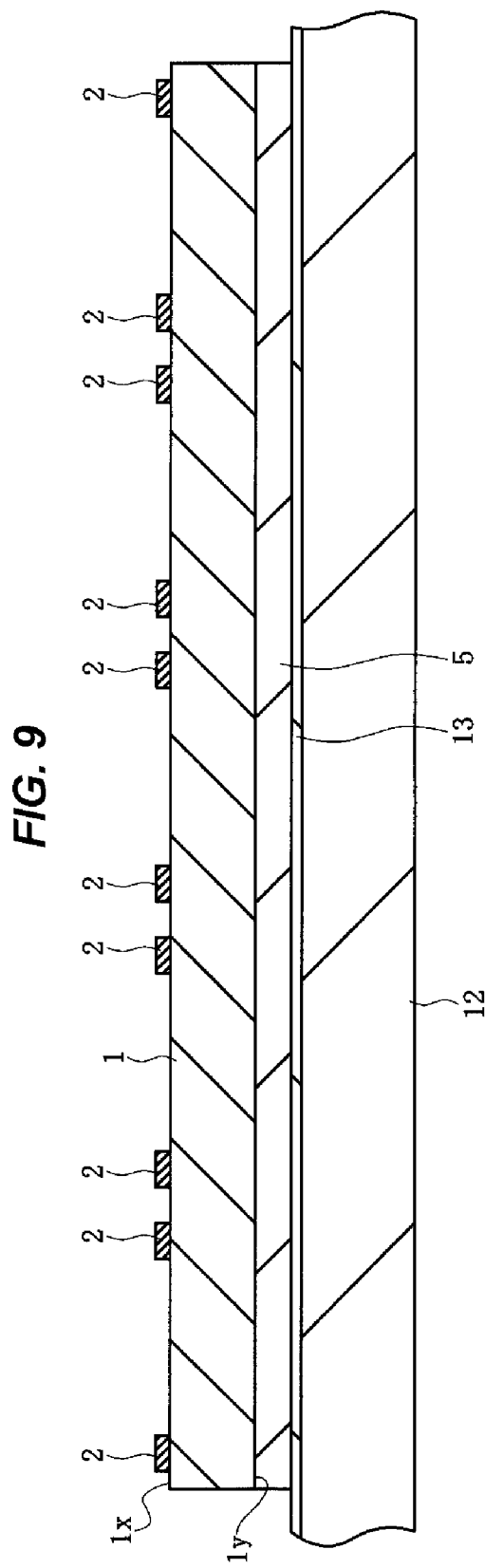
FIG. 9 is a main part cross-sectional view of the semiconductor device during a manufacturing process of the semiconductor device subsequent to FIG. 7.

Next, as shown in FIG. 9, a dicing tape 12 is prepared. It should be noted that although not shown, an annular frame is bonded to a periphery of the dicing tape 12 in the planar view. The dicing tape 12 is, for example, formed of polyolefin as a base material, and a thickness thereof is, for example, 90 μm. In addition, a second adhesive layer 13 is formed on an upper surface (surface to which the semiconductor wafer 1 is fixed) of the dicing tape 12. The second adhesive layer 13 is, for example, an acrylic UV-cured type adhesive, and has an adhesive force of 200 g/25 mm before UV irradiation, and an adhesive force of 10 to 20 g/25 mm after UV irradiation.

Next, the upper surface of the dicing tape 12 and the second principal surface 1y of the semiconductor wafer 1 are caused to face each other, and both of them are bonded to each other via the adhesive sheet 5 and the second adhesive layer 13. Because of this, the semiconductor wafer 1 is fixed to the upper surface of the dicing tape 12 via the adhesive sheet 5 and the second adhesive layer 13.

Wafer Dicing Process P6

Figure 10:
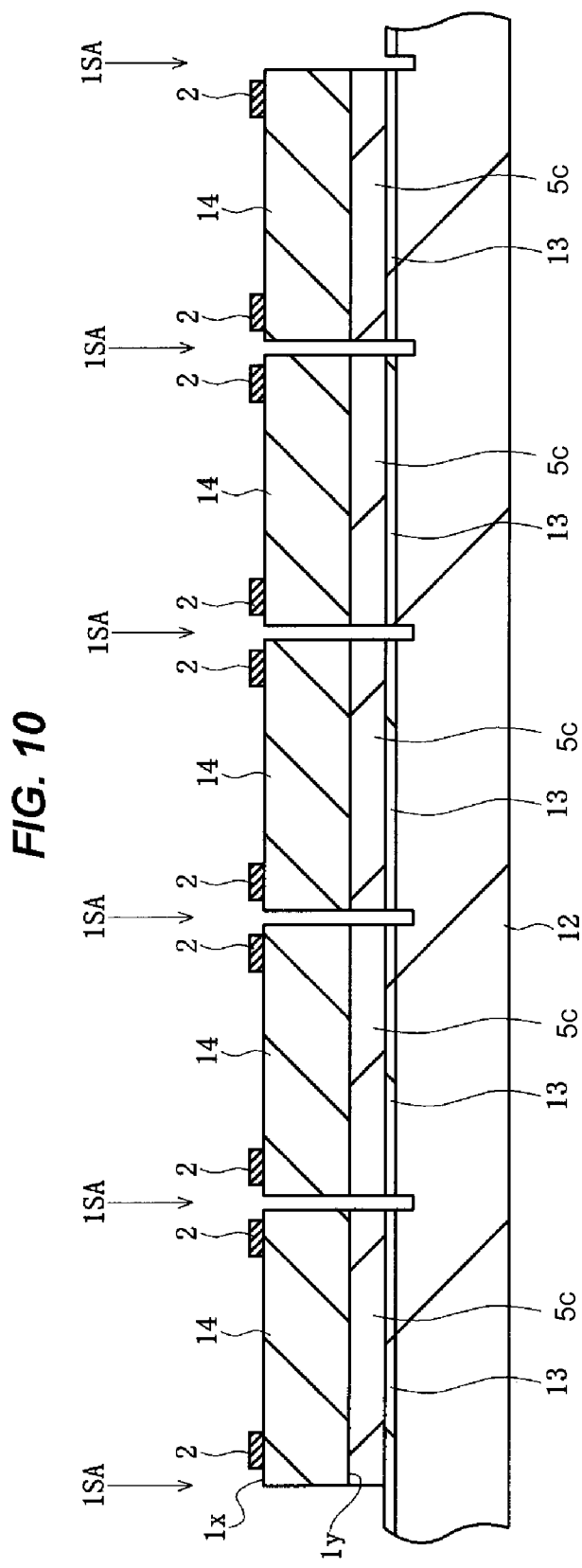
FIG. 10 is a main part cross-sectional view of the semiconductor device during a manufacturing process of the semiconductor device subsequent to FIG. 9.

Next, as shown in FIG. 10, the semiconductor wafer 1 is cut vertically and horizontally along the cutting regions 1SA, for example, using an ultrathin circular blade having diamond fine particles bonded thereto. Simultaneously, the adhesive sheet 5 and the second adhesive layer 13 are also cut vertically and horizontally along the cutting regions 1SA of the semiconductor wafer 1. Although the semiconductor wafer 1 is divided into the semiconductor chips 14, the semiconductor chips 14 are fixed to a frame via the dicing tape 12 even after being divided from the semiconductor wafer 1, and thus they are maintained in an aligned state. In addition, since the adhesive sheet 5 strongly adheres to the second principal surface 1y of the semiconductor wafer 1 in the earlier adhesive bonding process P3, there arises no such problem that the semiconductor chips 14 peel off from the adhesive patch 5c to cause scattering of the semiconductor chips 14.

Die Bonding Process (Third Temperature) P7

Next, as shown in FIGS. 11 and 12, a mother substrate (a substrate, a base material, metallic mother substrate or a mother material) 15 is prepared. The mother substrate 15 includes a conductive member such as stainless steel (SUS430) or copper, and it is the substrate for a number of semiconductor chips in which a region (chip mounting region DIA) where one semiconductor chip 14 is arranged is partitioned to be formed in a matrix form. In FIG. 11, the mother substrate 15 in which three blocks are formed is exemplified, the one block including the plurality of chip mounting regions DIA. A thickness of the mother substrate 15 is, for example, 150 μm.

The external terminals (electrodes) 16 are formed around the chip mounting regions DIA of an upper surface (a front surface or a chip mounting surface) of the mother substrate 15. The external terminal 16 includes, for example, a stacked film in which an Au film, an Ni film, and an Au film or an Ag film are formed sequentially from the bottom by the electrolysis plating method, and it has a mushroom shape in which the Ni film protrudes laterally. Although an upper surface of the external terminal 16 is located at a position higher than the chip mounting region DIA of the upper surface of the mother substrate 15, the external terminal 16 formed by the electrolysis plating method can be formed with a thickness approximately not more than a half of a thickness of a lead including a part of a lead frame formed by patterning a conductive substrate (metal plate). In addition, an anchor effect of the external terminal 16 can be expected in a molding process P10, which is a later manufacturing process, by forming a shape of the external terminal 16 as the mushroom shape. A thickness of the Au film configuring the external terminal 16 is, for example, not less than 0.1 μm, a thickness of the Ni film is, for example, 50 to 80 μm, and a thickness of the Au film or the Ag film is, for example, not less than 2.5 μm.

Next, the second adhesive layer 13 is cured by performing irradiation with an ultraviolet ray from a lower surface side of the dicing tape 12 to reduce an adhesive force of the second adhesive layer 13, for example, approximately to 10 to 20 g/25 mm. This allows each semiconductor chip 14 to easily peel off from the dicing tape 12.

Figure 13:
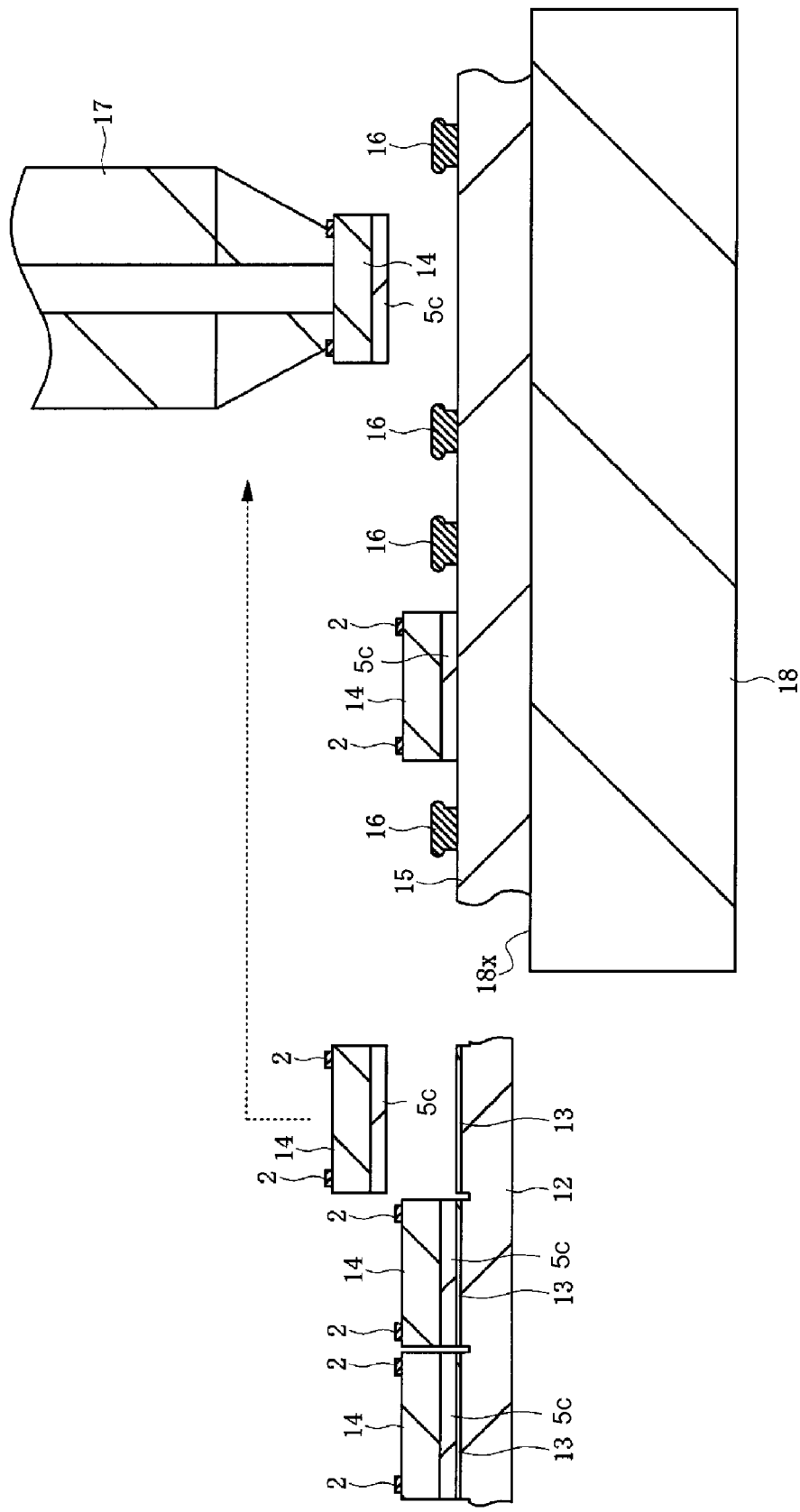
FIG. 13 is a main part cross-sectional view of the semiconductor device and a cylindrical collet during a manufacturing process of the semiconductor device subsequent to FIGS. 11 and 12.

Next, as shown in FIG. 13, a lower surface of the mother substrate 15 and a front surface (upper surface) 18x of a second support 18 having a heat source are caused to face each other, and the mother substrate 15 is placed over the front surface 18x of the second support 18. The second support 18 includes, for example, a conductive member, such as stainless steel (SUS430), and is heated to the third temperature (for example, 40 to 80° C.). Heat of the second support 18 is transferred to the mother substrate 15 which has been placed over the front surface 18x of the second support 18, and the mother substrate 15 is heated to a temperature approximately equal to the above-described third temperature.

Next, the front surface of the semiconductor chip 14 is sucked by the cylindrical collet 17 to be held as it is, and subsequently, the semiconductor chip 14 is peeled off from the dicing tape 12 to be picked up. Since the adhesive force of the second adhesive layer 13 is weakened, even the thin semiconductor chip 14 with a reduced strength can be reliably picked up. The adhesive 5 adheres to the back surface of the semiconductor chip 14.

Figure 14:
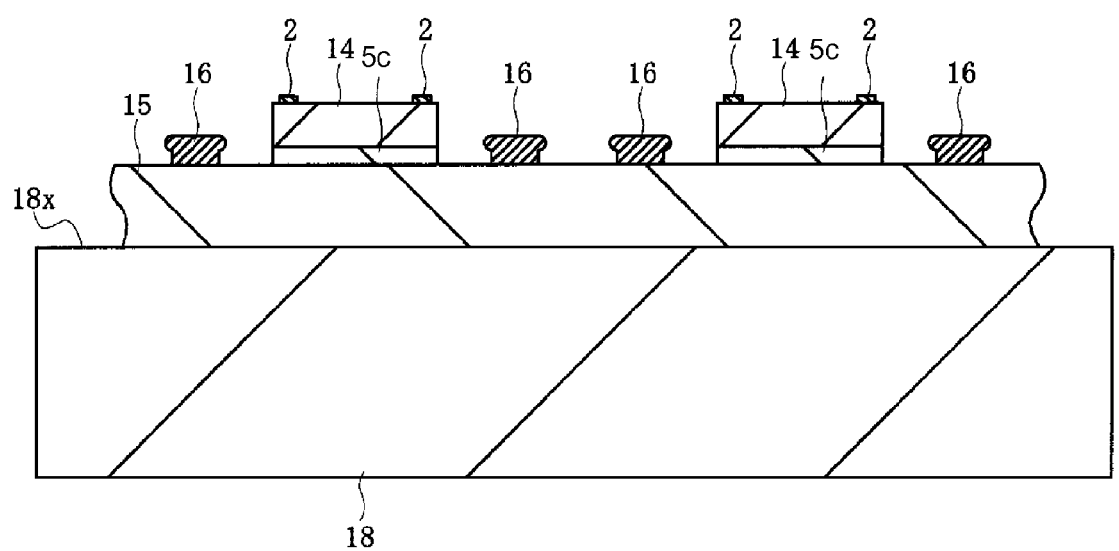
FIG. 14 is a main part cross-sectional view of the semiconductor device during a manufacturing process of the semiconductor device subsequent to FIG. 13.

Next, as shown in FIG. 14, the picked-up semiconductor chip 14 is transferred to a predetermined chip mounting region DIA of the upper surface of the mother substrate 15. Subsequently, the semiconductor chip 14 is placed in the chip mounting region DIA of the upper surface of the mother substrate 15 via the adhesive patch 5c adhering to the back surface of the semiconductor chip 14, and heat (for example, 40 to 80° C.) is applied to the semiconductor chip 14, whereby the semiconductor chip 14 is fixed to the chip mounting region DIA of the upper surface of the mother substrate 15.

Here, the third temperature of the second support 18, and a load in arranging the semiconductor chip 14 in the chip mounting region DIA of the upper surface of the mother substrate 15 are controlled so that the adhesive patch 5c becomes a desired state (shape). A desired state of the adhesive patch 5c preferably means a state where a side surface of the adhesive patch 5c is located closer to an inside than the side surface of the semiconductor chip 14 (a state where the side surface of the adhesive patch 5c is located between the back surface of the semiconductor chip 14 and the mother substrate 15), or a state where the side surface of the adhesive patch 5c is located in the same plane as the side surface of the semiconductor chip 14 without having a difference in level therefrom. In other words, in a plan view of the semiconductor chip 14 on the mother substrate 15, the adhesive patch 5c is not visible since the footprint of the semiconductor chip 14 fully overlaps that of the adhesive patch 5c.

Hereinafter, an undesired shape and a desired shape of the adhesive patch 5c will be described in detail by using FIGS. 15 and 16. FIGS. 15A and 15B show main part cross-sectional views of a semiconductor device having the adhesive patch 5c of the undesired shape, FIG. 16A shows a main part cross-sectional view of a first example semiconductor device having the adhesive patch 5c of the desired shape, and FIG. 16B shows a main part cross-sectional view of a second example semiconductor device having the adhesive patch 5c of the desired shape.

The undesired shape of the adhesive patch 5c means, as shown in FIG. 15A, the shape in which a side surface 5s of the adhesive patch 5c is located closer to an outside than a side surface 14s of the semiconductor chip 14, and in which a part of the adhesive patch 5c has protruded from the side surface 14s of the semiconductor chip 14 in the planar view. As described above, when the part of the adhesive patch 5c has protruded from the side surface 14s of the semiconductor chip 14 in the planar view, a part 5a of the adhesive patch 5c protruded from the side surface 14s of the semiconductor chip 14 in the planar view remains on the mother substrate 15 (poor transfer state) in a mother substrate peeling process P11, which is a later manufacturing process, as shown in FIG. 15B, and a crack (depression) 21a is formed in a lower surface of the resin sealing body 21 peeled off from the mother substrate 15. There is a risk that for example, moisture enters between the semiconductor chip 14 and the resin sealing body 21 from the crack 21a formed in the lower surface of the resin sealing body 21, and that the decrease in reliability of the semiconductor device occurs due to the moisture.

From the above, it is desirable that the adhesive patch 5c has a shape of not protruding from the side surface 14s of the semiconductor chip 14 in the planar view. That is, as shown in FIG. 16A, it is preferable to form the adhesive patch 5c not to be crushed too much so that the side surface 5s of the adhesive patch 5c and the side surface 14s of the semiconductor chip 14 are located in the same plane without having a difference in level from each other. Alternatively, as shown in FIG. 16B it is preferable to form the adhesive patch 5c not to be crushed too much so that the side surface 5s of the adhesive patch 5c is located closer to the inside than the side surface 14s of the semiconductor chip 14 (so that the side surface 5s of the adhesive patch 5c is located between the back surface of the semiconductor chip 14 and the mother substrate 15). Because of this, formation of the crack 21a in the lower surface of the above-mentioned resin sealing body 21 can be prevented.

Accordingly, in arranging the semiconductor chip 14 in the chip mounting region DIA of the upper surface of the mother substrate 15, it is important to prevent the adhesive patch 5c from being crushed to spread. Because of this, it is necessary to control the third temperature of the second support 18, and control the load in arranging the semiconductor chip 14 in the chip mounting region DIA of the upper surface of the mother substrate 15. Hereinafter, conditions for satisfying the above will be described.

(1). Regarding the third temperature of the second support 18, in FIG. 17, there is shown a graph chart illustrating a relation between an adhesive transfer rate (a probability that an adhesive remains on an upper surface of a mother substrate after being peeled off from the mother substrate) and the third temperature. The heat treatment conditions in the earlier wafer baking process P4, are set as a parameter. An adhesive transfer rate 0% serves as a good region, and adhesive transfer rates larger than 0% serve as a poor region.

Although the adhesive transfer rate depends also on the heat treatment conditions (the heat treatment temperature (second temperature) and a heat treatment time) in the wafer baking process P4, it becomes higher as the third temperature becomes higher. When 120° C. is selected as the heat treatment temperature (second temperature) and 60 minutes is selected as the heat treatment time in the wafer baking process P4, a range of 40 to 80° C. is considered to be the most preferred third temperature in consideration of margins of the heat treatment conditions, or the like.

Meanwhile, when a die shear strength (an adhesive force between the adhesive patch 5c and the mother substrate 15) is low, there is a risk that the semiconductor chip 14 peels off from the mother substrate 15 in a wire bonding process P9, which is a later manufacturing process. Therefore, it is necessary for the semiconductor device to have a predetermined die shear strength.

In FIG. 18, there is shown a graph chart illustrating a relation between the die shear strength and the third temperature. The heat treatment conditions in the earlier wafer baking process P4, are set as a parameter. Die shear strengths not less than 300 gr serve as a good region, and die shear strengths less than 300 gr serve as a poor region. A plane dimension of the semiconductor chip used for measuring the die shear strength is 0.8 mm by 0.8 mm.

Although the die shear strength depends also on the heat treatment conditions (the heat treatment temperature (second temperature) and the heat treatment time) in the wafer baking process P4, it becomes higher as the third temperature becomes higher. When 120° C. is selected as the heat treatment temperature (second temperature) and 60 minutes is selected as the heat treatment time in the wafer baking process P4, a good die shear strength can be obtained at the third temperature not less than 40° C.

Accordingly, 40 to 80° C. can be selected as the third temperature from the transfer rate and the die shear strength of the adhesive patch 5c.

(2). Regarding a temperature of the adhesive patch 5c, the adhesive patch 5c melts to deform without the application of a load when heat exceeding 40° C. is applied. Therefore, it is desirable that the heat exceeding 40° C. is not applied until just before the placement of the semiconductor chip 14 in the chip mounting region DIA of the upper surface of the mother substrate 15. In addition, also in causing the semiconductor chip 14 and the mother substrate 15 to adhere to each other via the adhesive patch 5c, it is desirable that the entire adhesive patch 5c is not melted but only a surface in contact with the mother substrate 15 is melted, and that a surface in contact with the semiconductor chip 14 and the side surface 5s are not melted. Consequently, in the embodiment, a heated support is used instead of using air baking in order to suppress deformation of the adhesive patch 5c as much as possible.

A temperature of the cylindrical collet 17 is a room temperature, and a temperature of the semiconductor chip 14 held by the cylindrical collet 17 and of the adhesive patch 5c adhering to the back surface of the semiconductor chip 14 is also the room temperature. In this state, the cylindrical collet 17 is moved over the chip mounting region DIA of the upper surface of the mother substrate 15 heated to the third temperature (for example, 40 to 80° C.). Subsequently, the semiconductor chip 14 is placed in the chip mounting region DIA of the upper surface of the mother substrate 15, but since the heated support (second support 18) is used, heat is applied only to a surface of the adhesive patch 5c in contact with the mother substrate 15, and only the adhesive patch 5c at the surface can be melted, which causes the adhesive patch 5c and the mother substrate 15 to adhere to each other. Since heat is not applied throughout the entire thickness of the adhesive patch 5c, deformation of the adhesive patch 5c can be suppressed.

(3). Regarding a load, since the adhesive patch 5c deforms due to its weight when melted, it is desirable to reduce the load applied to the semiconductor chip 14 as much as possible in order to suppress deformation of the adhesive patch 5c. For example, the semiconductor chip 14 may be just placed on the chip mounting region DIA of the upper surface of the mother substrate 15 without the application of the load. Thus, when the collet 17 places the semiconductor chip 14 having a part of the adhesive patch 5c on its second principal surface 1y onto the mother substrate, the placement imparts a sufficiently small enough pressure (which can be no pressure) to the upper surface of the mother substrate 15 so that no portion of the part of the adhesive patch 5c squeezes out from under the semiconductor chip 14 and/or the adhesive patch 5c is not deformed upon such placement. Thus, in a plan view of the semiconductor chip 14 on the mother substrate 15, the adhesive patch 5c is not visible since the footprint of the semiconductor chip 14 fully overlaps that of the adhesive patch 5c.

Adhesive Baking Process (Fourth Temperature) P8

Figure 19:
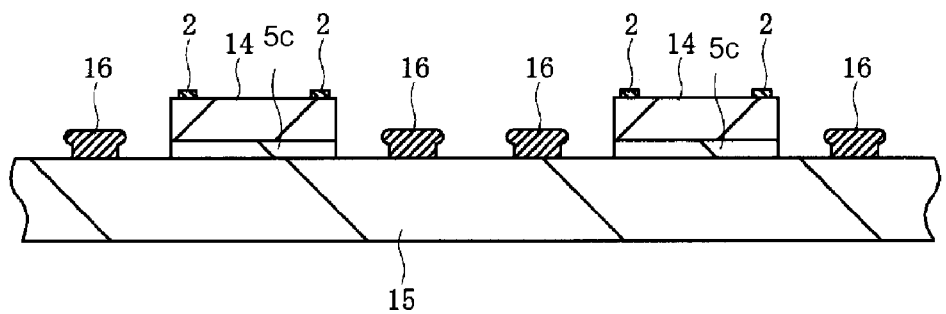
FIG. 19 is a main part cross-sectional view of the semiconductor device during a manufacturing process of the semiconductor device subsequent to FIG. 14.

Next, as shown in FIG. 19, heat treatment is performed on the mother substrate 15 having the semiconductor chip 14 bonded thereto. For this, the mother substrate 15 having the semiconductor chips 14 bonded thereto is heated for a period of time at a fourth temperature higher than the third temperature, the fourth temperature and the period of time being sufficient to bring the adhesive patch 5c from the partially-cured state to the fully-cured state. Also, this heat treatment is performed without pressing the adhesive patch 5c or the semiconductor chip 14 so as not deform the adhesive patch 5c. In one example, the mother substrate 15 is heated for approximately 60 minutes at a fourth temperature of 150° C. It will be understood, however, that other fourth temperatures and other periods of time may also be used, depending on the nature of the adhesive employed and the degree of its partial cure resulting from the application of the second temperature. The heat treatment is air baking using, for example, a baking furnace (heated chamber in which the mother substrate 15 having the semiconductor chips 14 bonded thereto is stored). Therefore, a curing reaction of the adhesive patch 5c is promoted, and the adhesive patch 5c is put into a completely cured state (third shape) from the partially-cured state (second shape). Because of this, the adhesive force of the semiconductor chip 14 and the mother substrate 15 via the adhesive patch 5c becomes stronger, and a hardness of the adhesive patch 5c becomes enhanced.

Wire Bonding Process P9

Figure 20:
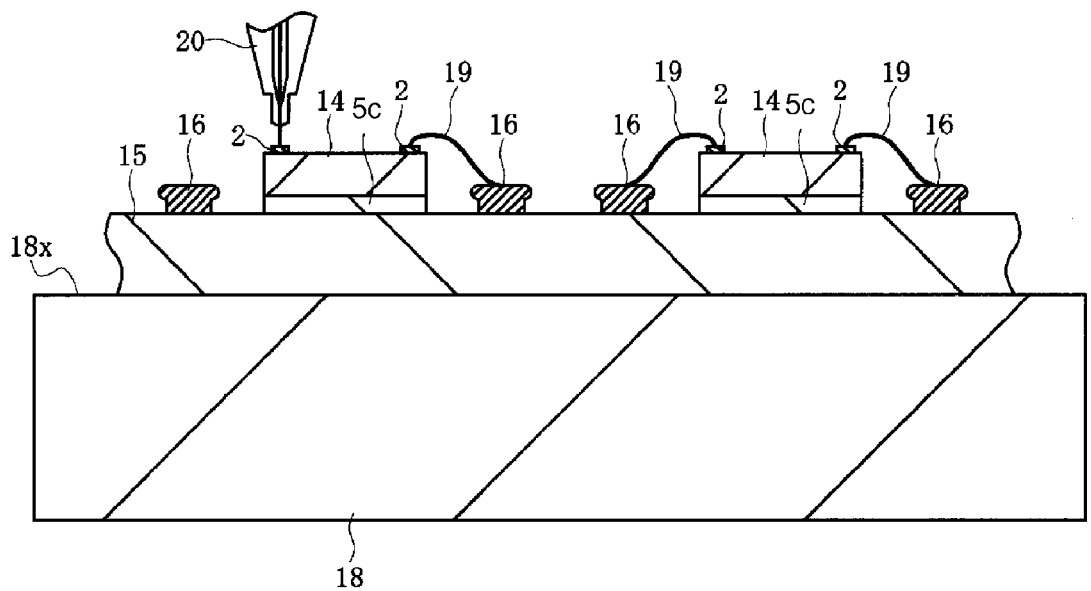
FIG. 20 is a main part cross-sectional view of the semiconductor device and a capillary during a manufacturing process of the semiconductor device subsequent to FIG. 19.
Figure 21:
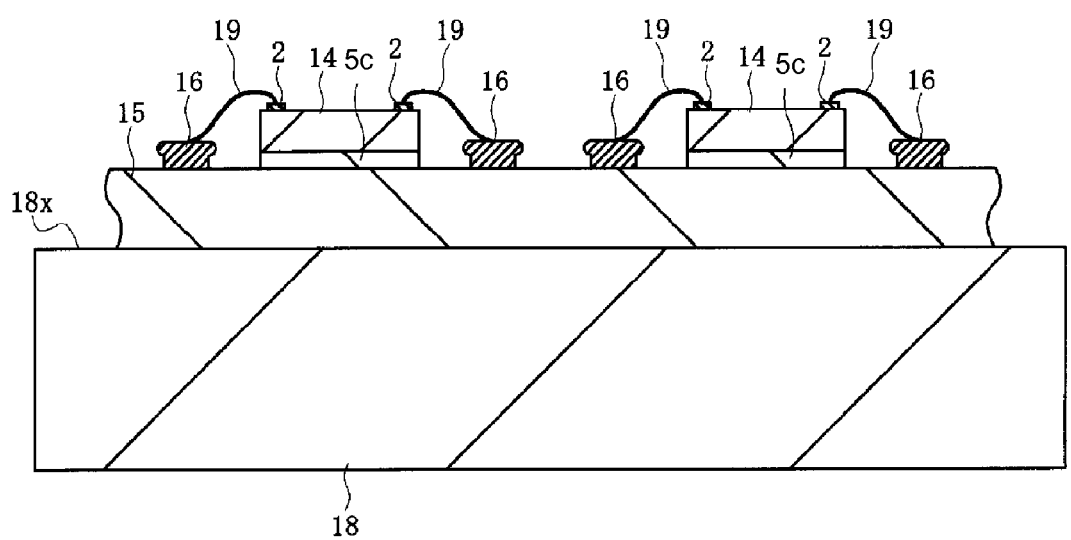
FIG. 21 is a main part cross-sectional view of the semiconductor device during a manufacturing process of the semiconductor device subsequent to FIG. 20.

Next, as shown in FIG. 20, the electrode pads 2 arranged at a margin of the front surface of the semiconductor chip 14, and the external terminals 16 formed around the chip mounting region DIA of the upper surface of the mother substrate 15 are electrically coupled to each other using the conductive members 19 for example, by a nail head bonding method (ball bonding method) using an ultrasonic vibration together for thermocompression bonding. For example, a wire (gold wire) is used for the conductive member 19. Specifically, a tip of the wire is melted by arc discharge to form a ball using a surface tension, and the ball is bonded by thermocompression over the electrode pad 2 and the external terminal 16 by a capillary (cylindrical connecting jig) 20, while, for example, a 120-kHz ultrasonic vibration is added.

In addition, although mainly a forward bonding method (a method in which after the electrode pad 2 of the semiconductor chip 14 and a part of the wire are connected to each other, the external terminal 16 and the other part of the wire are connected to each other) is used, a reverse bonding method (a method in which after the external terminal 16 and the part of the wire are connected to each other, the electrode pad 2 of the semiconductor chip 14 and the other part of the wire are connected to each other) may be used.

When the adhesive force of the semiconductor chip 14 and the mother substrate 15 is weak, or when the hardness of the adhesive patch 5c is insufficient, the ultrasonic wave attenuates to cause poor compression bonding of the wire (reduction in a joining strength of the wire). Therefore, it is necessary that the curing reaction of the adhesive patch 5c is promoted, and that the adhesive patch 5c is put into the completely cured state (third shape) in the previous adhesive baking process P8. In addition, since a load is applied to the semiconductor chip 14 in connecting the part of the wire to the electrode pad 2 of the semiconductor chip 14 even though the ultrasonic vibration is not added to the capillary 20, after all, it is preferable that the adhesive patch 5c is in the completely cured state (third shape).

Molding Process P10

Figure 22:
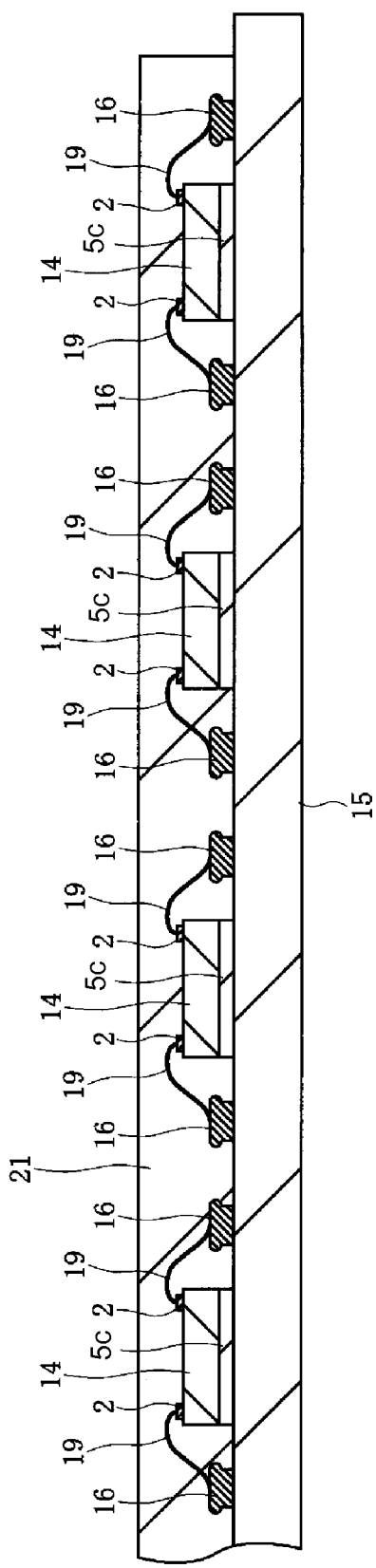
FIG. 22 is a main part cross-sectional view of the semiconductor device during a manufacturing process of the semiconductor device subsequent to FIG. 21.

Next, as shown in FIG. 22, the mother substrate 15 having the semiconductor chips 14 mounted thereon is set to a metal molding machine, sealing resin liquefied by raising a temperature is pumped and poured into a metal molding machine, and the upper surface side of the mother substrate 15 is sealed with the sealing resin to form one resin sealing body (sealing body) 21. Subsequently, for example, heat treatment (post-cure baking) for five hours is performed at a temperature of 175° C. This heat treatment is, for example, air baking. Because of this, the upper surfaces of the mother substrate 15, the semiconductor chips 14, parts of the respective external terminals 16 (the upper surfaces and the side surfaces), and the conductive members 19, etc. are sealed by the resin sealing body 21 which covers the upper surface side of the mother substrate 15. A thickness of the resin sealing body 21 is, for example, 300 μm. The resin sealing body 21 includes epoxy thermosetting insulating resin to which, for example, a phenolic curing agent, silicone rubber, and a number of fillers (for example, silica), etc. are added for the purpose of achieving low stress.

Mother Substrate Peeling Process P11

Figure 23:
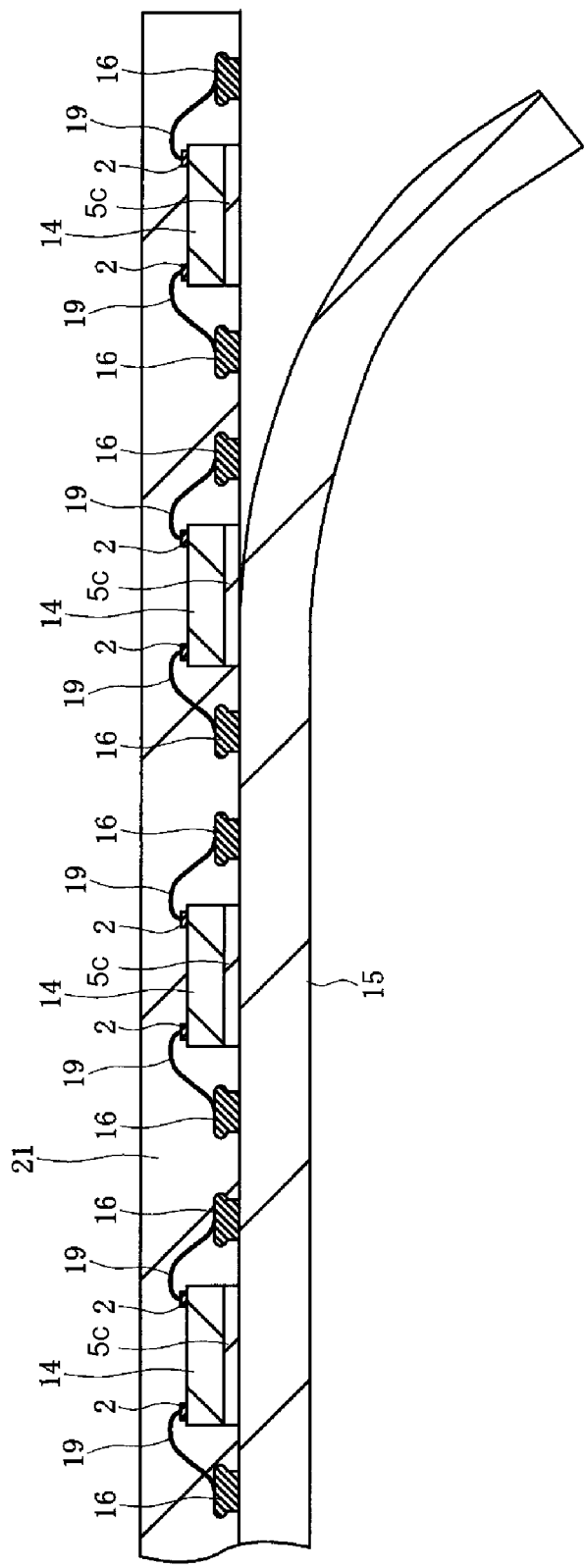
FIG. 23 is a main part cross-sectional view of the semiconductor device during a manufacturing process of the semiconductor device subsequent to FIG. 22.

Next, as shown in FIG. 23, the mother substrate 15 is peeled away from the resin sealing body 21 while being folded. Because of this, the adhesive patch 5c and the other parts (the lower surfaces or the mounting surfaces) of the respective external terminals 16 are exposed from the lower surface of the resin sealing body 21. Even after the mother substrate 15 is peeled away, the adhesive patch 5c adheres to the back surface of the semiconductor chip 14.

Laser Marking Process P12

Figure 24:
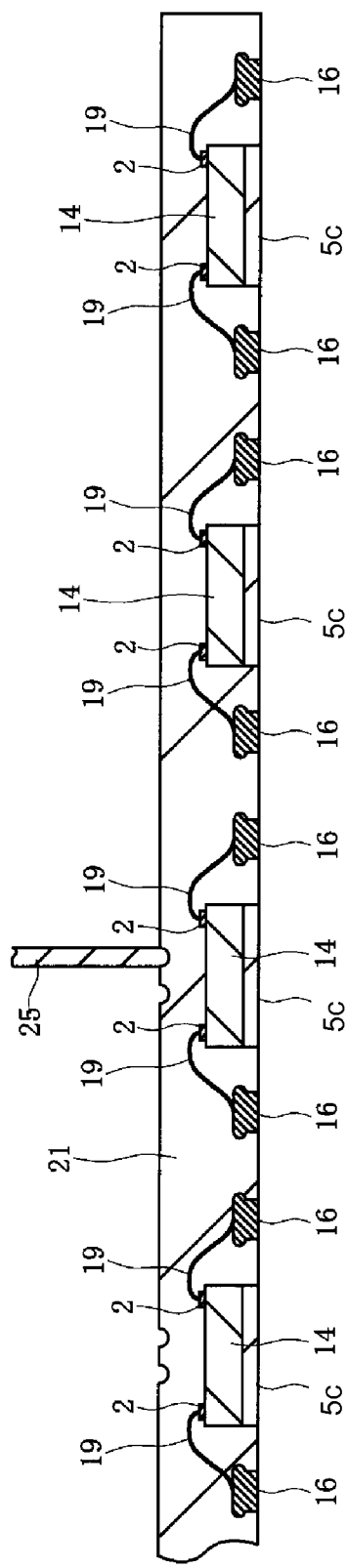
FIG. 24 is a main part cross-sectional view of the semiconductor device during a manufacturing process of the semiconductor device subsequent to FIG. 23.

Next, as shown in FIG. 24, a product name etc. are stamped to an upper surface of the resin sealing body 21 by using a laser 25.

Package Dicing Process P13

Figure 25:
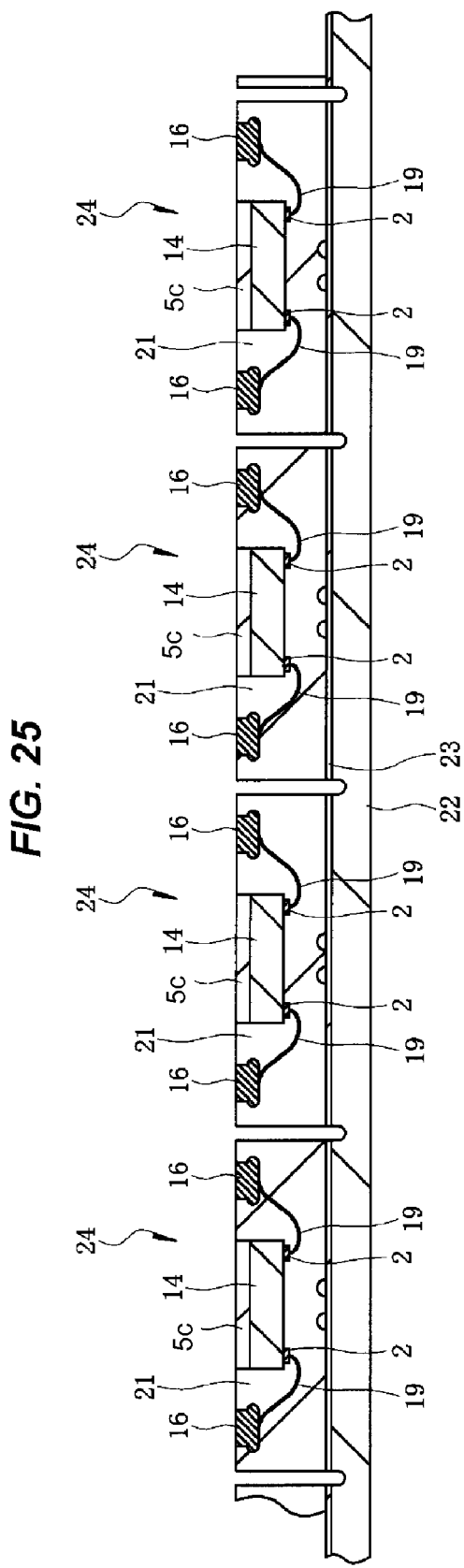
FIG. 25 is a main part cross-sectional view of the semiconductor device during a manufacturing process of the semiconductor device subsequent to FIG. 24.

Next, as shown in FIG. 25, a dicing sheet 22 is prepared. An adhesive layer 23 (third adhesive) is bonded to an upper surface of the dicing sheet 22. The adhesive layer 23 is, for example, an acrylic UV-cured type adhesive. Subsequently, the resin sealing body 21 which has covered the semiconductor chip 14, the parts (the upper surfaces and the side surfaces) of the respective external terminals 16, and the conductive members 19, etc. is fixed to the upper surface of the dicing sheet 22 via the adhesive layer 23.

Next, the resin sealing body 21 is cut vertically and horizontally from a lower surface side of the resin sealing body 21 along the scribe region, for example, using an ultrathin circular blade having diamond fine particles bonded thereto. Simultaneously, the adhesive layer 23 is also cut vertically and horizontally along the above-described scribe region. Although the resin sealing body 21 is divided into the semiconductor devices (semiconductor packages) 24, the semiconductor devices 24 are fixed via the dicing sheet 22 even after being divided, and thus they are maintained in an aligned state. Subsequently, the semiconductor device 24 is cleaned in order to remove scraps etc. generated in cutting the resin sealing body 21 and the adhesive layer 23.

Next, the irradiation with an ultraviolet ray is performed from a lower surface side of the dicing sheet 22 to thereby reduce an adhesive force of the adhesive layer 23. This allows the each semiconductor device 24 to easily peel off from the dicing sheet 22. Since the dicing sheet 22 includes an ultraviolet-transmitting material, it is possible to transmit an ultraviolet ray through the dicing sheet 22.

Figure 26:
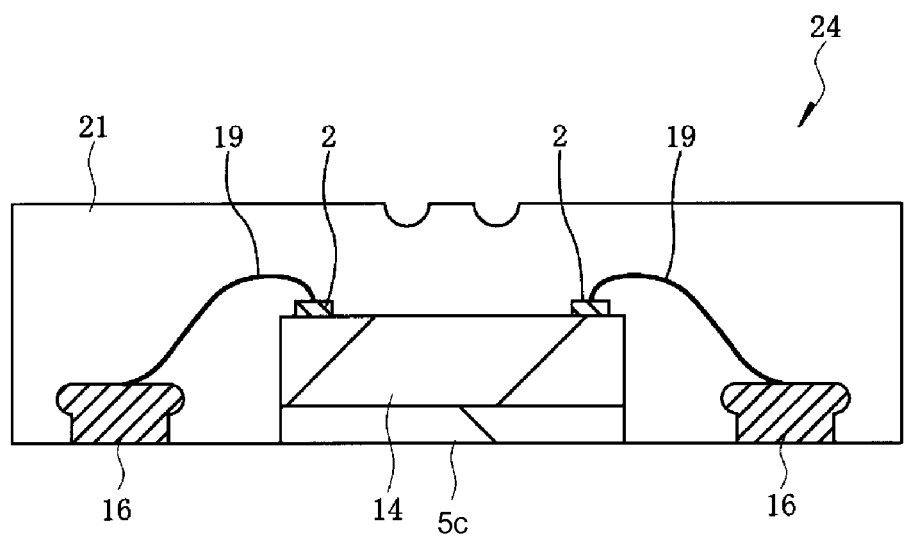
FIG. 26 is a main part cross-sectional view of the semiconductor device during a manufacturing process of the semiconductor device subsequent to FIG. 25.
Figure 27:
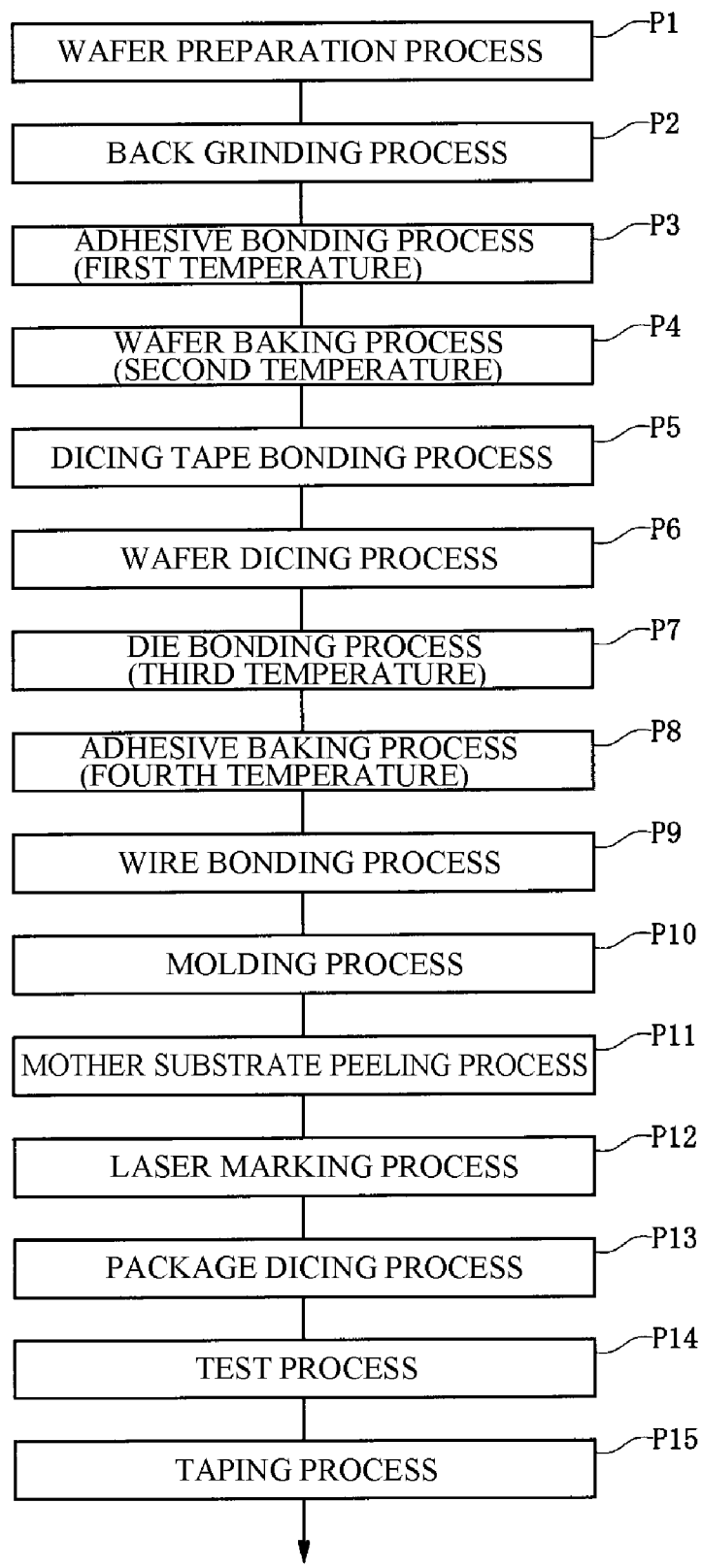
FIG. 27 is a process chart illustrating the manufacturing method of the semiconductor device according to the embodiment of the present invention.

Next, as shown in FIG. 26, the dicing sheet 22 is removed to thereby divide the resin sealing body 21 into the individual semiconductor device 24. On the lower surface of the resin sealing body 21 of the semiconductor device 24, there are exposed the lower surfaces (mounting surfaces) of the respective external terminals 16, and the adhesive patch 5c adhering to the respective back surfaces of the semiconductor chips 14. Accordingly, the respective back surfaces of the semiconductor chips 14 are protected by the adhesive patch 5c.

Test Process P14

Next, the semiconductor devices 24 are sorted in accordance with a product specification, further a final visual inspection is performed thereto, and then a product (semiconductor device 24) is completed.

Taping Process P15

Next, the product (semiconductor device 24) is stored in a depression previously formed in a carrier tape. Subsequently, for example, the carrier tape is taken up by a reel, and the reel is stored into a moisture-proof bag to be shipped in this state.

Modified Embodiment 1

Although the rollers (the first fixing roller 7, the second fixing roller 8, and the pressure roller 10) are used in bonding the adhesive sheet 5 to the semiconductor wafer 1 in the above-mentioned "adhesive bonding process (first temperature) P3", the present invention is not limited to this. For example, a method to use may be such that an adhesive sheet previously formed in accordance with an outer shape of the semiconductor wafer 1 is gradually caused to adhere from a center toward a periphery of the semiconductor wafer 1, and eventually, the adhesive sheet 5 is bonded to the entire second principal surface 1y of the semiconductor wafer 1.

Modified Embodiment 2

Although heat treatment is performed by air baking using the baking furnace in the above-mentioned "wafer baking process (second temperature) P4" and "adhesive baking process (fourth temperature) P8", the present invention is not limited to this. For example, heat treatment using the heated support may be performed in the same way as in the "die bonding process (third temperature) P7". However, since the "wafer baking process (second temperature) P4" and the "adhesive baking process (fourth temperature) P8" are intended to promote curing of the entire adhesive 5, it is preferable to use air baking using the baking furnace in which heat is easily transferred to the entire adhesive 5 in consideration of a curing speed of the adhesive 5 or uniformity of a shape of the adhesive 5 (the shape is not deformed non-uniformly).

Modified Embodiment 3

When wire bonding can be performed even though the adhesive patch 5c is in a partially-cured state, the "adhesive baking process (fourth temperature) P8" may be skipped. To be more specific, when the number of chip mounting regions DIA provided over the one mother substrate 15 is relatively large in the "die bonding process (third temperature) P7", in the semiconductor chip 14 placed in a first chip mounting region DIA, the adhesive patch 5c is subjected to the influence of heat until the semiconductor chip 14 is placed in a last chip mounting region DIA. Therefore, there is also a case where curing of the adhesive patch 5c has been already completed even if the "adhesive baking process (fourth temperature) P8" is not performed depending on a thermal history in the "die bonding process (third temperature) P7". However, since it is preferable that the semiconductor chip 14 does not move when an ultrasonic wave is added to the semiconductor chip 14 in order to improve the joining strength of the wire, it is preferable to further perform the "adhesive baking process (fourth temperature) P8" after performing the "die bonding process (third temperature) P7."

As described above, according to the embodiment, although the external terminal 16 is formed by the electrolysis plating method in which a conductive member such as stainless steel or copper is used as the mother substrate 15 in order to achieve reduction in size and reduction in thickness of the semiconductor device 24, the adhesive patch 5c bonded to the back surface of the semiconductor chip 14 does not remain on the mother substrate 15 when the mother substrate 15 is peeled off from the resin sealing body 21, and thus the lower surface of the resin sealing body 21 is not cracked. Furthermore, since the lower surface of the resin sealing body 21 is not cracked, and further the back surface of the semiconductor chip 14 is protected by the adhesive patch 5c, decrease in reliability of the semiconductor device can be suppressed, and reduction in size and reduction in thickness of the semiconductor device can be achieved.

Although the invention made by the present inventor has been specifically described based on the embodiment as described above, it is needless to say that the present invention is not limited to the above-described embodiment, and can be changed variously without departing from the scope thereof.

The present invention can be applied to manufacture of a semiconductor device in which a semiconductor chip is sealed by a resin sealing body.

What is claimed is:

1. A manufacturing method of a semiconductor device comprising the steps of:
   (a) providing a semiconductor wafer having a first principal surface, a plurality of chip regions provided on the first principal surface, a cutting region provided between mutually adjacent chip regions, and a second principal surface on the side opposite to the first principal surface;
   (b) after the step (a), placing the semiconductor wafer on a front surface of a first support heated to a first temperature so that the first principal surface of the semiconductor wafer faces the front surface of the first support, and bonding a film-like adhesive sheet to the second principal surface of the semiconductor wafer in a state where heat has been applied to the semiconductor wafer;
   (c) after the step (b), applying a second temperature higher than the first temperature to the semiconductor wafer having the adhesive sheet bonded thereto;
   (d) after the step (c), cutting the semiconductor wafer and the adhesive sheet along one or more of the cutting regions, and obtaining a semiconductor chip having an adhesive patch bonded thereto;
   (e) after the step (d), placing the semiconductor chip on an upper surface of a mother substrate with the adhesive patch facing the upper surface to thereby fix the semiconductor chip to the upper surface of the mother substrate, the mother substrate including a metal and being arranged on a front surface of a second support heated to a third temperature;
   (f) after the step (e), electrically coupling an electrode pad of the semiconductor chip and an external terminal of the mother substrate via a conductive member;
   (g) after the step (f), forming a sealing body by sealing with resin the semiconductor chip, the adhesive patch, and the upper surface of the mother substrate; and (h) after the step (g), peeling off the mother substrate from the sealing body, and exposing a back surface of the adhesive patch from the sealing body.

2. The manufacturing method of the semiconductor device according to claim 1, comprising between the step (e) and the step (f) the step of:
(e1) heating the mother substrate having the semiconductor chip fixed thereto at a fourth temperature higher than the third temperature.

3. The manufacturing method of the semiconductor device according to claim 2, wherein:
in the step (e1), the mother substrate is stored inside a chamber heated to the fourth temperature, whereby the semiconductor chip is heated.

4. The manufacturing method of the semiconductor device according to claim 2, wherein:
in the step (c), the adhesive sheet is brought to a partially cured state by the application of the second temperature, and
in the step (e1), the adhesive patch is brought to a completely cured state by the application of the fourth temperature.

5. The manufacturing method of the semiconductor device according to claim 1,
wherein in the step (b), the adhesive sheet is bonded to the second principal surface of the semiconductor wafer by rolling a roller over a first part of a periphery of the semiconductor wafer, then over a central part of the semiconductor wafer and finally over an opposite second part of the periphery of the semiconductor wafer.

6. The manufacturing method of the semiconductor device according to claim 1,
wherein in the step (c), the semiconductor wafer is stored inside a chamber heated to the second temperature, whereby the semiconductor wafer is heated.

7. The manufacturing method of the semiconductor device according to claim 1,
wherein in the step (f), a tip of the conductive member is bonded by thermocompression over an electrode pad of the semiconductor chip through the use of a capillary while an ultrasonic vibration is added.

8. The manufacturing method of the semiconductor device according to claim 1,
wherein in the step (c), the adhesive sheet is brought to a partially cured state by the application of the second temperature.

9. The manufacturing method of the semiconductor device according to claim 1,
wherein in the step (e), the adhesive patch does not protrude from a side surface of the semiconductor chip in a planar view.

10. The manufacturing method of the semiconductor device according to claim 1,
wherein the first temperature is 80 to 100° C., and the third temperature is 40 to 80° C.

11. The manufacturing method of the semiconductor device according to claim 1,
wherein a thickness of the adhesive is 20 to 30 μm.

12. The manufacturing method of the semiconductor device according to claim 1, wherein:
in the step (b), the first support is heated to a first temperature of 80° C. to 100° C., and the adhesive sheet is pressed against the second principal surface of the semiconductor wafer to promote bonding of the adhesive sheet to the semiconductor wafer.

13. The manufacturing method of the semiconductor device according to claim 12, wherein:
in the step (c), without pressing the adhesive sheet against the second principal surface, the semiconductor wafer is heated at a second temperature of 115° C. to 125° for between 45 minutes and 75 minutes, whereby the adhesive sheet is brought to a partially cured state.

14. The manufacturing method of the semiconductor device according to claim 13, wherein:
in the step (c), the semiconductor wafer thereto is heated at a second temperature of about 120° C. for about 60 minutes.

15. The manufacturing method of the semiconductor device according to claim 13, wherein:
the adhesive sheet is about 35%-65% cured after the step (c).

16. The manufacturing method of the semiconductor device according to claim 13, comprising between the step (e) and the step (f), the step of:
(e1) heating the mother substrate having the semiconductor chip fixed thereto at a fourth temperature for a length of time, the fourth temperature and the length of time being sufficient to bring the adhesive patch to a fully-cured state from the partially-cured state, the fourth temperature being higher than the third temperature.

17. The manufacturing method of the semiconductor device according to claim 16, wherein in the step (e1):
the adhesive patch is brought to the fully cured state from the partially cured state without pressing the adhesive patch.

18. The manufacturing method of the semiconductor device according to claim 16, wherein:
the third temperature is 40° to 80°; and
in the step (e1), the mother substrate is heated at a fourth temperature of about 150° for about 60 minutes.

19. The manufacturing method of the semiconductor device according to claim 13, wherein:
after the step (a) and prior to the step (b), applying a front protection tape to the first principal surface of the semiconductor wafer;
in the step (b), covering the adhesive sheet with back protection sheet while pressure is being applied to bond the adhesive sheet to the second principal surface of the semiconductor wafer; and
after the step (b) and prior to the step (c), removing the front protection tape and the back protection sheet.

20. The manufacturing method of the semiconductor device according to claim 13, wherein:
after the step (e), in a plan view of the semiconductor chip fixed to upper surface of the mother substrate, the adhesive patch does not protrude from a side surface of the semiconductor chip.

21. The manufacturing method of the semiconductor device according to claim 13, wherein:
in the step (e), while placing the semiconductor chip on the mother substrate, imparting sufficiently small enough pressure to the upper surface of the mother substrate such that no portion of the adhesive patch squeezes out from under the semiconductor chip.

22. The manufacturing method of the semiconductor device according to claim 13, wherein: in the step (e), the semiconductor chip is fixed to the upper surface of the mother substrate without melting an entire thickness of the adhesive patch.

23. A manufacturing method of a semiconductor device in preparation for sealing with a sealing body, the semiconductor device comprising a semiconductor chip bonded to an adhesive, the method comprising:

(a) providing a semiconductor wafer having a first principal surface, a plurality of chip regions provided on the first principal surface, a cutting region provided between mutually adjacent chip regions, and a second principal surface on the side opposite to the first principal surface;

(b) after the step (a), heating the semiconductor wafer at a first temperature while pressing a film-like adhesive sheet against the second principal surface of the semiconductor wafer to thereby bond the adhesive sheet to the semiconductor wafer;

(c) after the step (b), heating the semiconductor wafer at a second temperature higher than the first temperature to bring the adhesive sheet to a partially cured state, without pressing the adhesive sheet against the second principal surface;

(d) after the step (c), cutting the semiconductor wafer and the adhesive sheet along one or more cutting regions to obtain a semiconductor chip having an adhesive patch bonded thereto;

(e) after the step (d), placing the semiconductor chip on an upper surface of a heated metallic mother substrate with the adhesive patch of the semiconductor chip facing the upper surface, while the metallic mother substrate is being heated at a third temperature lower than the second temperature so that a surface of the adhesive patch melts and thereby fixes the semiconductor chip to the metallic mother substrate; and (f) after the step (e), heating the metallic mother substrate at a fourth temperature higher than the third temperature and for a sufficient period of time such that the adhesive patch is brought from the partially cured state to a fully cured state.

24. The manufacturing method of a semiconductor device according to claim 23, wherein:
in step (b), the first temperature is 80° C. to 100° C.;
in step (c), the second temperature is 115° C. to 125° C. and the semiconductor wafer is heated for between 45 minutes and 75 minutes; and
in step (e), the third temperature is 40° C. to 80° C.

25. The manufacturing method of the semiconductor device according to claim 24, wherein, in the step (c), the second temperature is about 120° C. and the semiconductor wafer is heated for about 60 minutes.

26. The manufacturing method of a semiconductor device according to claim 24, wherein, in step (f), the fourth temperature is about 150° and the metallic mother substrate is heated for about 60 minutes.

27. The manufacturing method of the semiconductor device according to claim 23, wherein:
the adhesive sheet is about 35%-65% cured after the step (c).

28. The manufacturing method of the semiconductor device according to claim 23, wherein, in the step (f), the adhesive patch is brought to the fully cured state from the partially cured state without pressing the adhesive patch.

29. The manufacturing method of the semiconductor device according to claim 23, wherein:
after the step (a) and prior to the step (b), applying a front protection tape to the first principal surface of the semiconductor wafer;
in the step (b), covering the adhesive sheet with back protection sheet while pressure is being applied to bond the adhesive sheet to the second principal surface of the semiconductor wafer; and
after the step (b) and prior to the step (c), removing the front protection tape and the back protection sheet.

30. The manufacturing method of the semiconductor device according to claim 23, wherein, after the step (e), in a plan view of the semiconductor chip fixed to upper surface of the metallic mother substrate, the adhesive patch does not protrude from a side surface of the semiconductor chip.

31. The manufacturing method of the semiconductor device according to claim 23, wherein, in the step (e), while placing the semiconductor chip on the metallic mother substrate, imparting sufficiently small enough pressure to the upper surface of the metallic mother substrate such that no portion of the adhesive patch squeezes out from under the semiconductor chip.

32. The manufacturing method of the semiconductor device according to claim 23, wherein: in the step (e), the semiconductor chip is fixed to the upper surface of the metallic mother substrate without melting an entire thickness of the adhesive patch.

33. The manufacturing method of a semiconductor device according to claim 23, further comprising the steps:
(g) after step (f), electrically coupling an electrode pad of the semiconductor chip and an external terminal of the metallic mother substrate via a conductive member; and
(h) after the step (g), forming a sealing body by sealing with resin the semiconductor chip, the adhesive patch, and the upper surface of the metallic mother substrate; and
(i) after the step (h), peeling off the metallic mother substrate from the sealing body, and exposing a back surface of the adhesive patch from the sealing body.

* * * * *